(12) United States Patent
Kim et al.

(10) Patent No.: US 12,067,205 B2
(45) Date of Patent: Aug. 20, 2024

(54) DISPLAY DEVICE

(71) Applicant: Samsung Display Co., Ltd., Yongin-si (KR)

(72) Inventors: Ki Cheol Kim, Yongin-si (KR); Gyeong Nam Bang, Seoul (KR); Hwan Hee Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/106,997

(22) Filed: Feb. 7, 2023

(65) Prior Publication Data
US 2023/0185419 A1    Jun. 15, 2023

Related U.S. Application Data

(63) Continuation of application No. 17/728,912, filed on Apr. 25, 2022, now Pat. No. 11,592,950, which is a
(Continued)

(30) Foreign Application Priority Data

Jul. 26, 2019    (KR) .......................... 10-2019-0091268

(51) Int. Cl.
*G06F 3/045*    (2006.01)
(52) U.S. Cl.
CPC .... *G06F 3/045* (2013.01); *G06F 2203/04102* (2013.01)
(58) Field of Classification Search
CPC ........... G06F 3/045; G06F 2203/04102; G06F 3/0443; G06F 3/04164; G06F 3/0412; H10K 59/40; H10K 59/131; H10K 71/60
See application file for complete search history.

(56) References Cited

U.S. PATENT DOCUMENTS 9,543,533 B2 * 1/2017 Yamazaki ............ H10K 59/131
9,786,229 B2 * 10/2017 Lee ......................... H10K 71/00
(Continued)

FOREIGN PATENT DOCUMENTS

KR    10-2017-0106621    9/2017
KR    10-2018-0119198    11/2018
(Continued)

OTHER PUBLICATIONS

Non-Final Office Action mailed Sep. 15, 2021, in U.S. Appl. No. 16/851,100.
(Continued)

*Primary Examiner* — Bryan Earles
(74) *Attorney, Agent, or Firm* — Lewis Roca Rothgerber Christie LLP

(57) ABSTRACT

A display device including a substrate having an active area and a non-active area having first to fourth areas, a light-emitting element on the substrate, a touch layer having a main touch area overlapping the active area, and an encapsulation layer between the light-emitting element and the touch layer, in which the first area is between the active area and the second area, the third area is between the second and fourth areas, the touch layer includes touch electrodes and touch lines connected to the touch electrodes, the touch lines include a first touch line part overlapping the first area and a second touch line part overlapping the third area, the first touch line part includes first and second touch conductive layers of the touch layer, and the second touch line part includes the first touch conductive layer and does not include the second touch conductive layer.

29 Claims, 22 Drawing Sheets

Related U.S. Application Data continuation of application No. 16/851,100, filed on Apr. 17, 2020, now Pat. No. 11,314,369.

(56) References Cited

U.S. PATENT DOCUMENTS

| | | | |
|---|---|---|---|
| 10,418,436 B2 * | 9/2019 | Tomioka | H10K 50/8445 |
| 10,748,970 B2 * | 8/2020 | Kim | G01K 7/16 |
| 10,768,732 B2 * | 9/2020 | Lee | G06F 3/0412 |
| 10,855,825 B2 * | 12/2020 | Yuan | G09F 9/30 |
| 11,093,076 B2 * | 8/2021 | Kim | G06F 3/04166 |
| 2010/0225624 A1 | 9/2010 | Fu et al. | |
| 2014/0217373 A1 | 8/2014 | Youn et al. | |
| 2016/0018348 A1 * | 1/2016 | Yau | G06F 3/0443 |
| | | | 324/697 |
| 2017/0288005 A1 | 10/2017 | Kawata | |
| 2018/0151662 A1 * | 5/2018 | Rhe | H10K 59/40 |
| 2018/0308903 A1 | 10/2018 | Jeong et al. | |
| 2018/0321764 A1 | 11/2018 | Oh | |
| 2018/0329552 A1 | 11/2018 | Song et al. | |
| 2019/0369787 A1 | 12/2019 | Park et al. | |
| 2020/0066822 A1 | 2/2020 | Saitoh et al. | |

FOREIGN PATENT DOCUMENTS

| | | |
|---|---|---|
| KR | 10-2018-0124326 | 11/2018 |
| KR | 10-2019-0137192 | 12/2019 |

OTHER PUBLICATIONS

Notice of Allowance issued Dec. 27, 2021, in U.S. Appl. No. 16/851,100.

Notice of Allowance issued Oct. 27, 2023=2, in U.S. Appl. No. 17/728,912.

* cited by examiner

TCL1: CP2, TCE11, TCE12
TCL2: CP1, SPL1, SPL2, TCE21, TCE22

DISPLAY DEVICE

CROSS-REFERENCE TO RELATED APPLICATIONS

This application is a Continuation of U.S. patent application Ser. No. 17/728,912, filed on Apr. 25, 2022, which is a continuation of U.S. patent application Ser. No. 16/851,100, filed on Apr. 17, 2020, now issued as U.S. Pat. No. 11,314,369, which claims priority from and the benefit of Korean Patent Application No. 10-2019-0091268, filed on Jul. 26, 2019, each of which is hereby incorporated by reference for all purposes as if fully set forth herein.

BACKGROUND

Field

Exemplary embodiments of the invention relate generally to a display device.

Discussion of the Background

Electronic devices that provide images to a user, such as a smart phone, a tablet PC, a digital camera, a laptop computer, a navigation device, and a smart TV, include a display device for displaying images. Such a display device includes a display panel for generating and displaying an image and various input means.

Recently, a touch member that can detect a touch input is employed in a display device for smart phones and tablet PCs. Such a touch member may be formed directly on a display member in order to simplify the manufacturing process and reduce the thickness of the display device. The touch member generally includes two conductive layers, i.e., a first conductive layer and a second conductive layer, and may further include a first insulating layer for insulating the first conductive layer from conductive layers thereunder, and a second insulating layer for insulating the first conductive layer from the second conductive layer. However, outside air, moisture, and the like may permeate through the exposed second conductive layer of the touch member, which may cause failure of the touch member.

The above information disclosed in this Background section is only for understanding of the background of the inventive concepts, and, therefore, it may contain information that does not constitute prior art.

SUMMARY

Display devices constructed according to exemplary embodiments of the invention have a thin thickness and include a touch member capable of preventing a conductive layer of the touch member from being exposed.

Additional features of the inventive concepts will be set forth in the description which follows, and in part will be apparent from the description, or may be learned by practice of the inventive concepts.

A display device according to an exemplary embodiment includes a display member including a substrate having an active area and a non-active area around the active area, and light-emitting elements disposed on the substrate, the non-active area including a bending region, and a touch member disposed on the display member and having a main touch area, in which the touch member includes touch electrodes disposed in the main touch area and touch lines connected to the touch electrodes, the main touch area corresponding to the active area and a portion of the touch lines corresponding to the non-active area, the touch lines include a first touch line part disposed on an upper side of the bending region, and a second touch line part disposed on a lower side of the bending region, and a number of conductive layers forming the first touch line part is greater than a number of conductive layers forming the second touch line part.

The touch member may include a first touch insulating layer disposed on the display member, a first touch conductive layer disposed on the first touch insulating layer, a second touch insulating layer disposed on the first touch conductive layer, and a second touch conductive layer disposed on the second touch insulating layer, in which the first touch line part may include the first touch conductive layer and the second touch conductive layer electrically connected to the first touch conductive layer, and the second touch line part may include the first touch conductive layer.

The first touch conductive layer may include a (1-1) touch connection electrode disposed in the main touch area and forming the first touch line part, and a (1-2) touch connection electrode forming the second touch line part, the second touch conductive layer may include a (2-1) touch connection electrode forming the first touch line part, and the (1-1) touch connection electrode and the (2-1) touch connection electrode may overlap each other in a thickness direction and be electrically connected to each other through a first contact hole.

The display device may further include a polarization member disposed on the upper side of the bending region on the first touch line part, in which the polarization member may include a polarizing layer and a polarizing adhesive layer disposed on the polarizing layer and directly contacting the (2-1) touch connection electrode.

The touch lines may further include a third touch line part disposed between the first touch line part and the second touch line part, in which the third touch line part may include a source connection electrode disposed in the bending region and electrically connected to the (2-1) touch connection electrode through a second contact hole.

The second contact hole may be disposed in the bending region.

The display member may further include a buffer layer disposed on the substrate, a first display conductive layer disposed on the buffer layer, a first insulating layer disposed on the first display conductive layer, a second display conductive layer disposed on the first insulating layer, and a protective layer disposed on the second display conductive layer.

The display device may further include a via layer disposed between the second display conductive layer and the substrate, and a bending protective layer disposed between the via layer and the protective layer in the bending region, in which the second display conductive layer may include the source connection electrode.

The touch lines may further include a fourth touch line part disposed between the third touch line part and the second touch line part, in which the second touch conductive layer may further include a (2-2) touch connection electrode forming the fourth touch line part and overlapping the (1-2) touch connection electrode in a thickness direction.

The (2-2) touch connection electrode may be electrically connected to the source connection electrode through a third contact hole, and be electrically connected to the (1-2) touch connection electrode through a fourth contact hole, the third contact hole may be disposed closer to the bending region than the fourth contact hole.

The bending protective layer may be extended to the upper side of the bending region and be in contact with an upper surface and a side surface of the (2-1) touch connection electrode.

The third contact hole may be disposed in the bending region, and the fourth contact hole may be disposed on the lower side of the bending region.

A side surface of the bending protective layer may be in direct contact with a side surface of the polarization member.

The touch lines may further include a third touch line part disposed between the first touch line part and the second touch line part, and the third touch line part may include a source connection electrode disposed in the bending region and electrically connected to the (1-1) touch connection electrode through a second contact hole disposed in the bending region.

The (1-2) touch connection electrode may be electrically connected to the source connection electrode through a third contact hole disposed in the bending region, and the third contact hole may be disposed closer to the lower side of the bending region than the second contact hole.

A first width of the first touch line part may be less than a second width of the second touch line part.

The display device may further include a light-blocking pattern overlapping the upper side of the bending region on the touch member, and a color filter layer, in which the light-blocking pattern may be in direct contact with the second touch conductive layer.

A display device according to another exemplary embodiment includes a display member including a substrate having an active area and a non-active area around the active area, and light-emitting elements disposed on the substrate, the non-active area including a bending region, and a touch member disposed on the display member and having a main touch area, in which the touch member includes touch electrodes disposed in the main touch area and touch lines connected to the touch electrodes, the main touch area corresponding to the active area and a portion of the touch lines corresponding to the non-active area, the touch lines include a first touch line part disposed on an upper side of the bending region, and a second touch line part disposed on a lower side of the bending region, and a first width of first touch line part is less than a second width of the second touch line part.

The touch member may include a first touch insulating layer disposed on the display member, a first touch conductive layer disposed on the first touch insulating layer, a second touch insulating layer disposed on the first touch conductive layer, and a second touch conductive layer disposed on the second touch insulating layer, in which the first touch line part may include the first touch conductive layer and the second touch conductive layer electrically connected to the first touch conductive layer, and the second touch line part may include the first touch conductive layer.

The first touch conductive layer may include a (1-1) touch connection electrode disposed on the upper side of the bending region and forming the first touch line part, and a (1-2) touch connection electrode forming the second touch line part, the second touch conductive layer may include a (2-1) touch connection electrode forming the first touch line part, and the (1-1) touch connection electrode and the (2-1) touch connection electrode may overlap each other in a thickness direction and be electrically connected to each other through a first contact hole.

The touch lines may further include a third touch line part disposed between the first touch line part and the second touch line part, the third touch line part including a source connection electrode disposed in the bending region and electrically connected to the (2-1) touch connection electrode through a second contact hole, in which a third width of the third touch line part may be greater than the first width of the first touch line part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
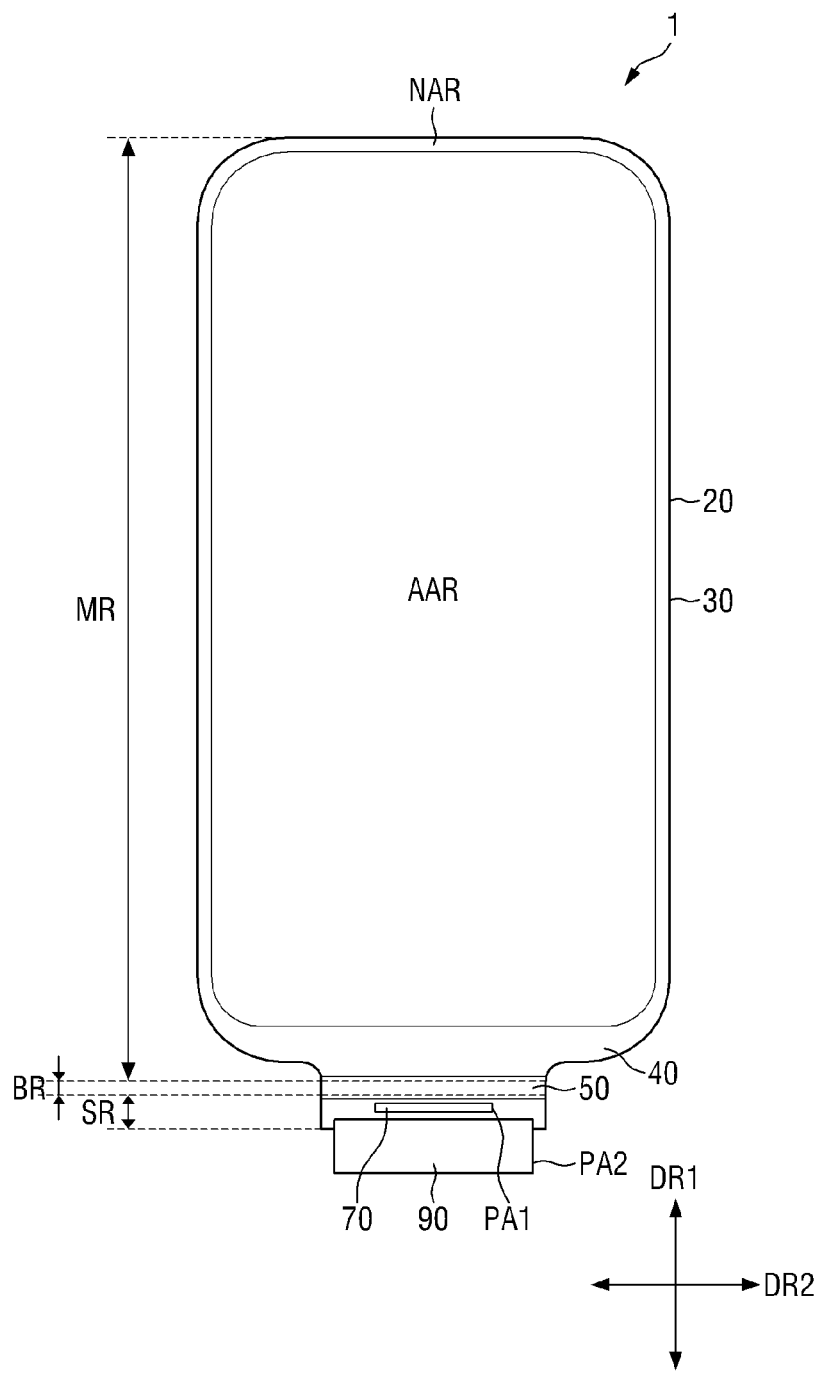
FIG. 1 is a plan view showing the layout of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
FIG. 2 is a cross-sectional view of a display device that is bent according to an exemplary embodiment.
Figure 3:
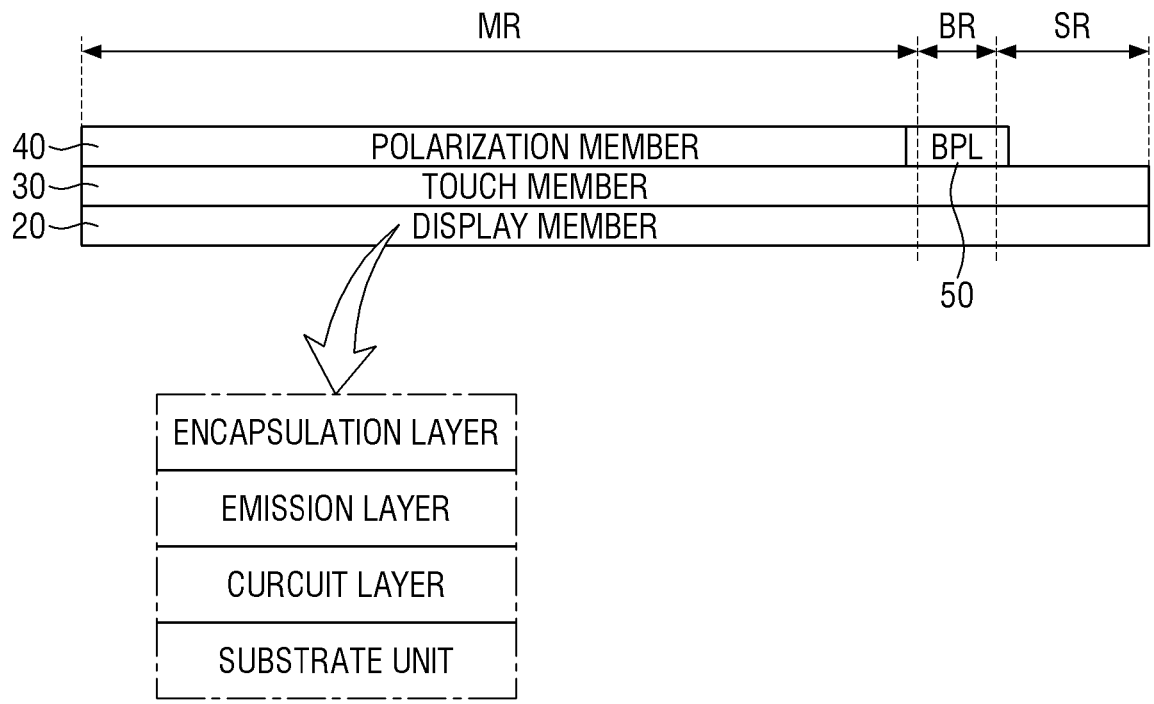
FIG. 3 is a cross-sectional view of a display device according to an exemplary embodiment.

FIG. 1 is a plan view showing the layout of a display device according to an exemplary embodiment. FIG. 2 is a cross-sectional view of a part of a display device according to an exemplary embodiment. FIG. 3 is a cross-sectional view of a display device according to an exemplary embodiment.

In some exemplary embodiments, the first direction D1 may intersect the second direction D2. In the plan view of FIG. 1, the first direction DR1 is defined as the vertical direction and the second direction DR2 is defined as the horizontal direction. Hereinafter, the upper arrow in the first direction DR1 indicates the upper side, the lower arrow in the first direction DR1 indicates the lower side, the right arrow in the second direction DR2 indicates the right side, and the left arrow in the second direction DR2 indicates the left side when viewed from the top. However, it should be noted that the directions described herein are relative terms, and thus, the inventive concepts are not limited to the directions described.

Referring to FIGS. 1 to 3, a display device 1 may refer to any electronic device providing a display screen. The display device 1 may include portable electronic devices for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console, and a digital camera, as well as a television set, a laptop computer, a monitor, an electronic billboard, the Internet of Things devices, etc.

The display device 1 includes an active area AAR and a non-active area NAR. In the display device 1, a display area may be defined as an area where images are display, a non-display area may be defined as an area where no image is displayed, and a touch area may be defined as an area where a touch input is sensed. The display area and the touch area may be included in the active area AAR. The display area and the touch area may overlap each other. More particularly, in the active area AAR, images are displayed and a touch input is sensed as well. The shape of the active area AAR may be a rectangle or a rectangle with rounded corners. In FIG. 1, the active area AAR is illustrated as a rectangle with rounded corners and having the sides in the first direction DR1 longer than the sides in the second direction DR2. However, the inventive concepts are not limited thereto. For example, in some exemplary embodiments, the active area AAR may have a variety of shapes, such as a rectangular shape having the sides in the second direction DR2 longer than the sides in the first direction DR1, a square shape, other polygonal shapes, a circular shape, and an oval shape.

The non-active area NAR is disposed around the active area AAR. The non-active area NAR may be a bezel area. The non-active area NAR may surround each side (e.g., four sides in the drawings) of the active area AAR. However, the inventive concepts are not limited thereto. For example, the non-active area NAR may not be disposed near the upper side of the active region AAR or near the left or right side thereof.

In the non-active area NAR, signal lines for applying signals to the active area AAR (display area or touch area) or driving circuits may be disposed. The non-active area NAR may not include a display area or a touch area. In another exemplary embodiment, the non-active area NAR may include a part of the touch area, and a sensor member, such as a pressure sensor, may be disposed in the part of the touch area. In some exemplary embodiments, the active area AAR may be completely overlap to the display area where images are displayed, and the non-active area NAR may be completely overlap the non-display area where no image is displayed.

The display device 1 includes a display panel 10 for providing a display screen. The display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. Hereinafter, the display panel 10 will be described with reference to an organic light-emitting display panel, however, the inventive concepts are not limited thereto. For example, in some exemplary embodiments, the display panel 10 may include any other types of the display panel.

The display device 1 may further include a touch member for sensing a touch input. The touch member may be provided as a panel or film separated from the display panel 10 to be attached on the display panel 10, or may be provided in the form of a touch layer inside the display panel 10. Hereinafter, although the touch member will be described as being provided inside the display panel to be included in the display panel 10, the inventive concepts are in the following description, it is to be understood that the present disclosure is not limited thereto.

The display panel 10 may include a flexible substrate including a flexible polymer material, such as polyimide. Accordingly, the display panel 10 may be curved, bent, folded, or rolled.

The display panel 10 may include a bending region BR. The display panel 10 may be divided into a main region MR located on one side of the bending region BR, and a subsidiary region SR located on the other side of the bending region BR. The non-active area NAR of the display device 1 may include the bending region BR. The non-active area NAR may be divided into an upper area on the upper side of bending region BR, and a lower area on the lower side of the bending region BR in the first direction DR1 of FIG. 1. The upper area on the upper side of the bending region BR may be located in a main region MR, while the lower area on the lower side of the bending region BR may be located in a subsidiary region SR, which will be described in more detail later.

The display area of the display panel 10 is located in the main region MR. The display area includes a plurality of pixels. According to an exemplary embodiment, the edge portions of the display area in the main region MR, the entire bending region BR, and the entire subsidiary region SR may be the non-display area. However, the inventive concepts are not limited thereto. For example, in some exemplary embodiments, the bending region BR and/or the subsidiary region SR may also include the display area.

The main region MR may have a shape generally similar to the appearance of the display device 1 when viewed from the top. The main region MR may be a flat region located in one plane. However, the inventive concepts are not limited thereto. For example, in some exemplary embodiments, at least one of the edges of the main region MR except for the edge (side) connected to the bending region BR may be bent, to form a curved surface or may be bent at a right angle.

When at least one of the edges of the main region MR, except for the edge (side) connected to the bending region BR, is curved or bent, the display area may also be disposed at the edge. However, the inventive concepts are not limited thereto. For example, in some exemplary embodiments, the curved or bent edge may be the non-display area that does not display image, or the display area and the non-display area may be disposed together.

The bending region BR is connected to one side of the main region MR in the first direction DR1. For example, the bending region BR may be connected to the lower shorter side of the main region MR. The width of the bending region BR may be less than the width (width of the shorter side) of the main region MR. The portions where the main region MR meet the bending region BR may be cut in an L-shape.

In the bending region BR, the display panel 10 may be bent downward in the thickness direction, e.g., in a direction away from the display surface with a curvature. The bending region BR may have a constant radius of curvature, however, the inventive concepts are not limited thereto. For example, in some exemplary embodiments, the bending region BR may have different radii of curvature for difference sections. As the display panel 10 is bent at the bending region BR, the surface of the display panel 10 may be reversed. In particular, the surface of the display panel 10 facing upward may be bent, such that it faces outward at the bending region BR and then faces downward.

The subsidiary region SR is extended from the bending region BR. The sub-region SR may be extended in a direction substantially parallel to the main region MR after the display device has been bent. The sub region SR may overlap with the main region MR in the thickness direction of the display panel 10. The width of the subsidiary region SR (the width in the second direction DR2) may be equal to the width of the bending region BR, without being limited thereto.

The sub region SR may include a first pad area PA1 and a second pad area PA2 located farther from the bending region BR than the first pad area PA1 as shown in the plan view of FIG. 1. A driving chip 70 may be disposed in the first pad area PA1 of the sub region SR. The driving chip 70 may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

A plurality of display signal line pads and a plurality of touch signal line pads may be disposed in the second pad area PA2 of the sub region SR of the display panel 10. A driving board 90 may be connected to the second pad area PA2 of the subsidiary region SR of the display panel 10. The driving board 90 may be a flexible printed circuit board or a film.

Referring to FIG. 3, the display panel 10 may include a display member 20, a touch member 30, a polarization member 40, and a bending protective layer (BPL) 50. The display member 20 may be disposed across the main area MR, the bending region BR, and the subsidiary region SR. As shown in the enlarged view of FIG. 3, the display member 20 includes a substrate unit 101 (see also FIG. 4), a circuit layer TR disposed on the substrate unit 101, an emission layer 122 disposed on the circuit layer TR, and an encapsulation layer 116 disposed on the light-emission layer 122. The display panel 10 may further include a first electrode 121 disposed under the emissive layer, and a second electrode 123 disposed on the emissive layer (see FIG. 4). The first electrode, the emission layer, and the second electrode may form a light-emitting element. The light-emitting element may be disposed in each of the pixels.

The shape of the display member 20 may be substantially identical to the shape of the display panel 10 described above when viewed from the top. More particularly, the display member 20 may have a shape substantially identical to the shape of the main region MR, the bending region BR, and the subsidiary region SR when viewed from the top.

The touch member 30 may be disposed on the display member 20. The touch member 30 may be disposed across the main area MR, the bending region BR, and the subsidiary region SR. The touch member 30 may be formed directly on the display member 20. As will be described later, the touch member 30 may include a first touch insulating layer, a first touch conductive layer disposed on the first touch insulating layer, a second touch insulating layer disposed on the first touch conductive layer, and a second touch conductive layer disposed on the second touch insulating layer.

The second touch conductive layer may be the top layer of the touch member 30. The second touch conductive layer and the second touch insulating layer of the touch member 30 may be exposed to the outside. According to an exemplary embodiment, the thickness of the display device 1 can be reduced by disposing the second touch conductive layer at the top of the touch member 30 and eliminating a protective layer covering the second touch conductive layer, such as an organic layer.

Since the second touch conductive layer is exposed, however, external air or moisture may permeate into the second touch conductive layer, which may result in corrosion of the second touch conductive layer. As such, in the display panel 10 according to an exemplary embodiment, the polarization member 40 is disposed in the main region MR and the bending protective layer 50 is disposed in the bending region BR, to cover the second touch conductive layer for protection. In the subsidiary region SR exposed by the bending protective layer 50, the second touch conductive layer may not be disposed and the second touch insulating layer may be positioned at the top. Accordingly, it is possible to prevent the first touch conductive layer from being corroded by being exposed to the outside. The polarization member 40 and the bending protective layer 50 may be disposed on the touch member 30.

The shape of the touch member 30 may be substantially identical to the shape of the display member 20 when viewed from the top. In particular, the touch member 30 may have a shape substantially identical to the shape of the main region MR, the bending region BR, and the subsidiary region SR when viewed from the top.

As shown in FIG. 3, the polarization member 40 may overlap with the main region MR generally in the thickness direction and may not be disposed in the bending region BR. The bending protective layer 50 may overlap with the bending region BR completely and may be expanded to a part of the main region MR and the subsidiary region SR adjacent to the bending region BR. The side surface of the polarization member 40 may be in contact with the side surface of the bending protective layer 50. In particular, no spacing is formed between the side surface of the polarization member 40 and the side surface of the bending protective layer 50. The boundary between the side surface of the bending protective layer 50 and the side surface of the polarization member 40 may be located in the main region MR.

Referring back to FIG. 1, the shape of the polarization member 40 may be substantially identical to the shape of the portion of the touch member 30 in the main region MR described above when viewed from the top. In some exemplary embodiments, the polarization member 40 may be smaller than the touch member 30 when viewed from the top, so that a part of the edge of the portion of the touch member 30 in the main region MR may be exposed. The shape of the bending protective layer 50 may be substantially identical to the shape of the portion of the touch member 30 falling within the bending region BR described above when viewed from the top. The shape of the bending protective layer 50 when viewed from the top may be substantially a rectangular. In some exemplary embodiments, the bending protective layer 50 may be smaller than the touch member 30 when viewed from the top. More particularly, the width of the bending protective layer 50 in the second direction DR2 may be smaller than the width of the touch member 30 in the second direction DR2.

Figure 4:
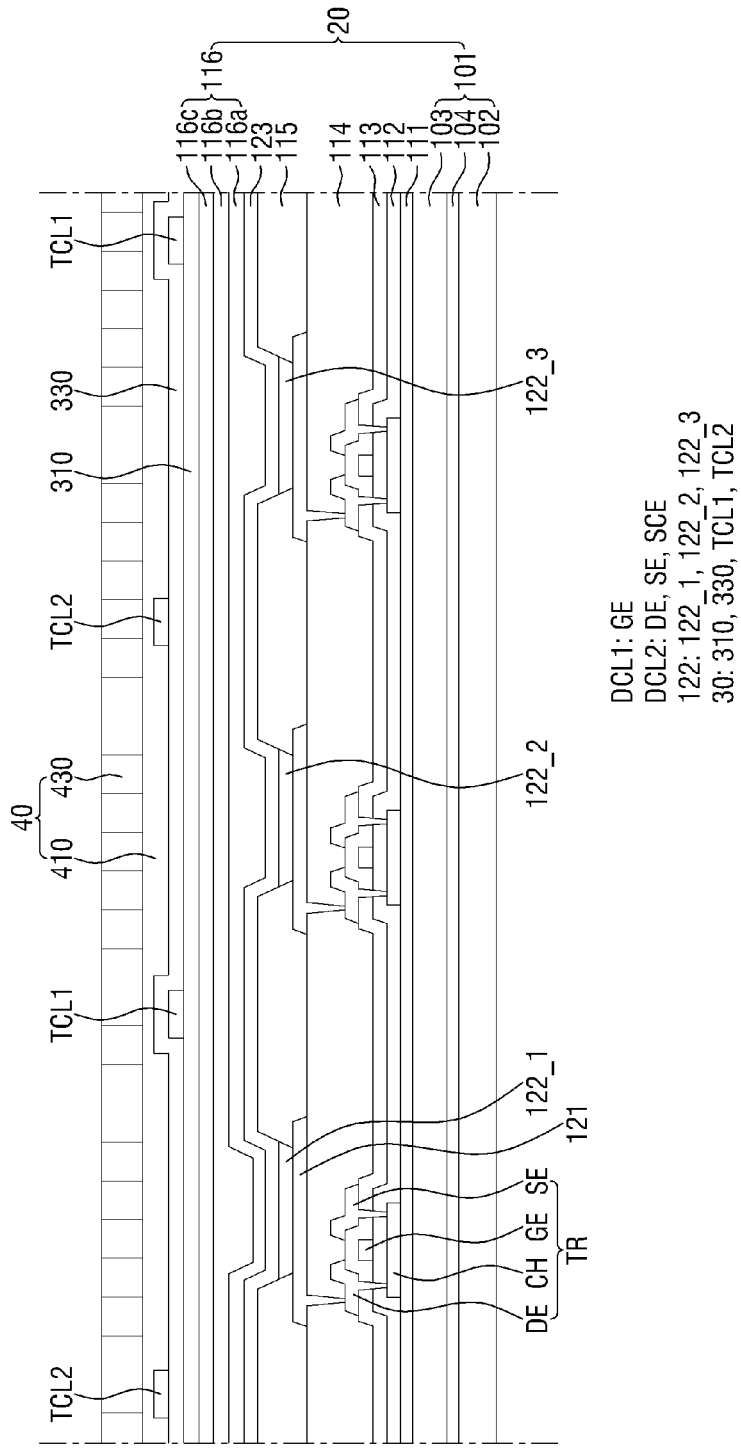
FIG. 4 is a cross-sectional view of a main region of a display device according to an exemplary embodiment.
Figure 5:
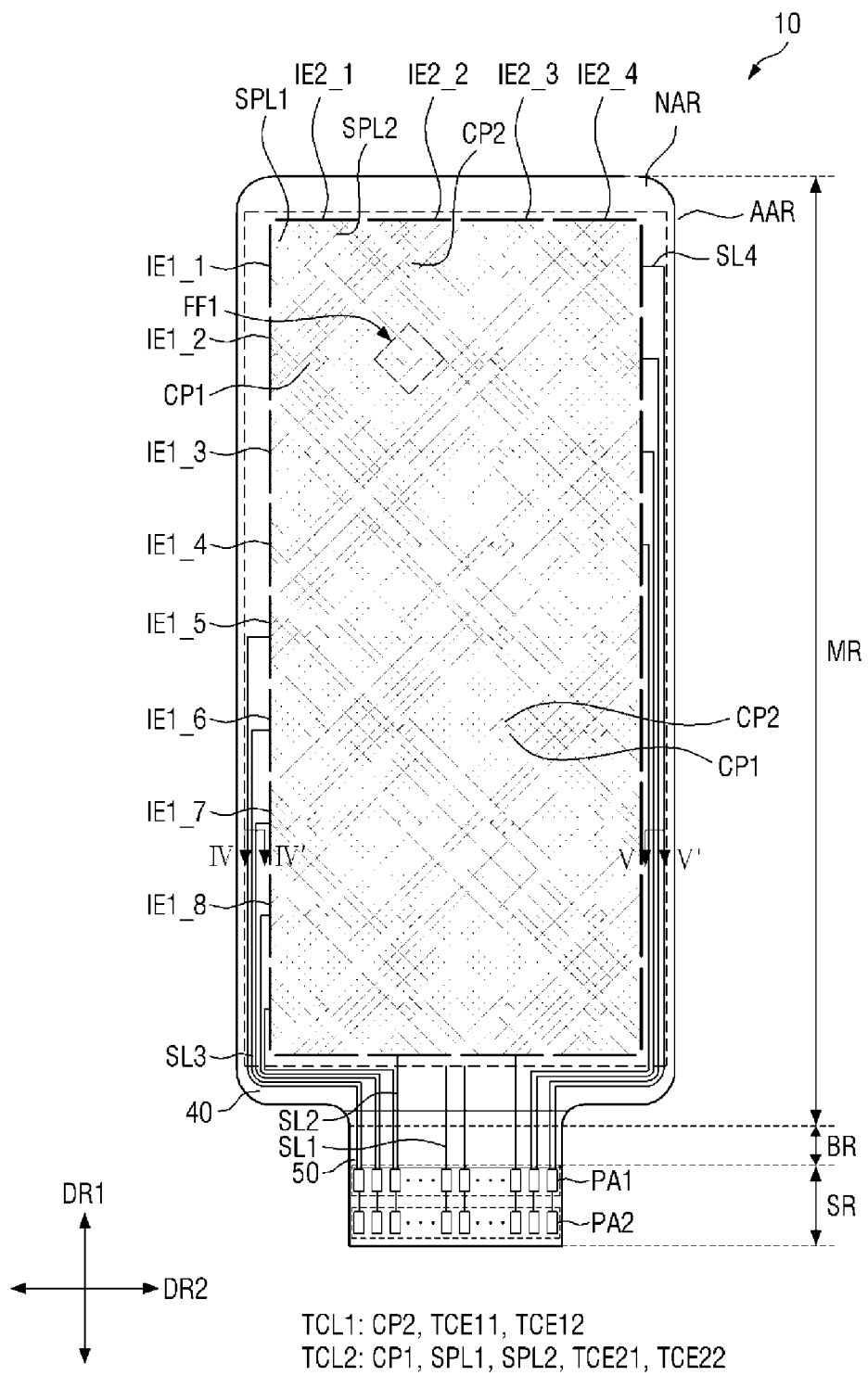
FIG. 5 is a plan view showing a layout of a display member and a touch member of a display device according to an exemplary embodiment.
Figure 6:
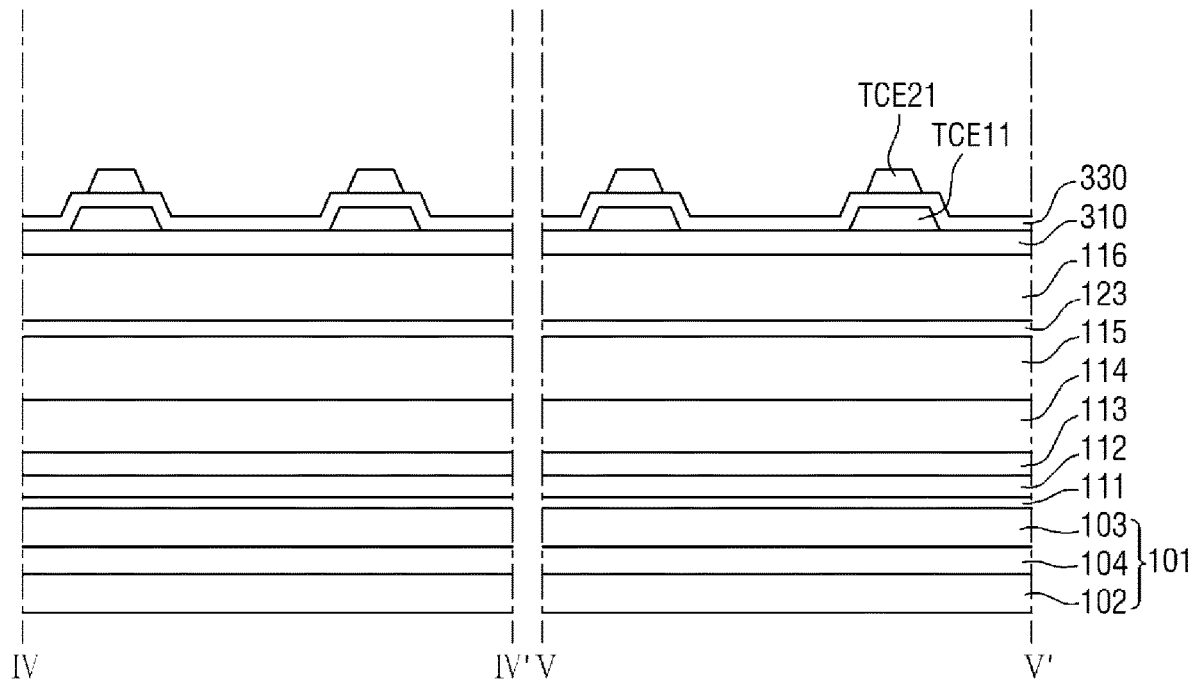
FIG. 6 shows cross-sectional views taken along line IV-IV' and V-V of FIG. 5, respectively.
Figure 7:
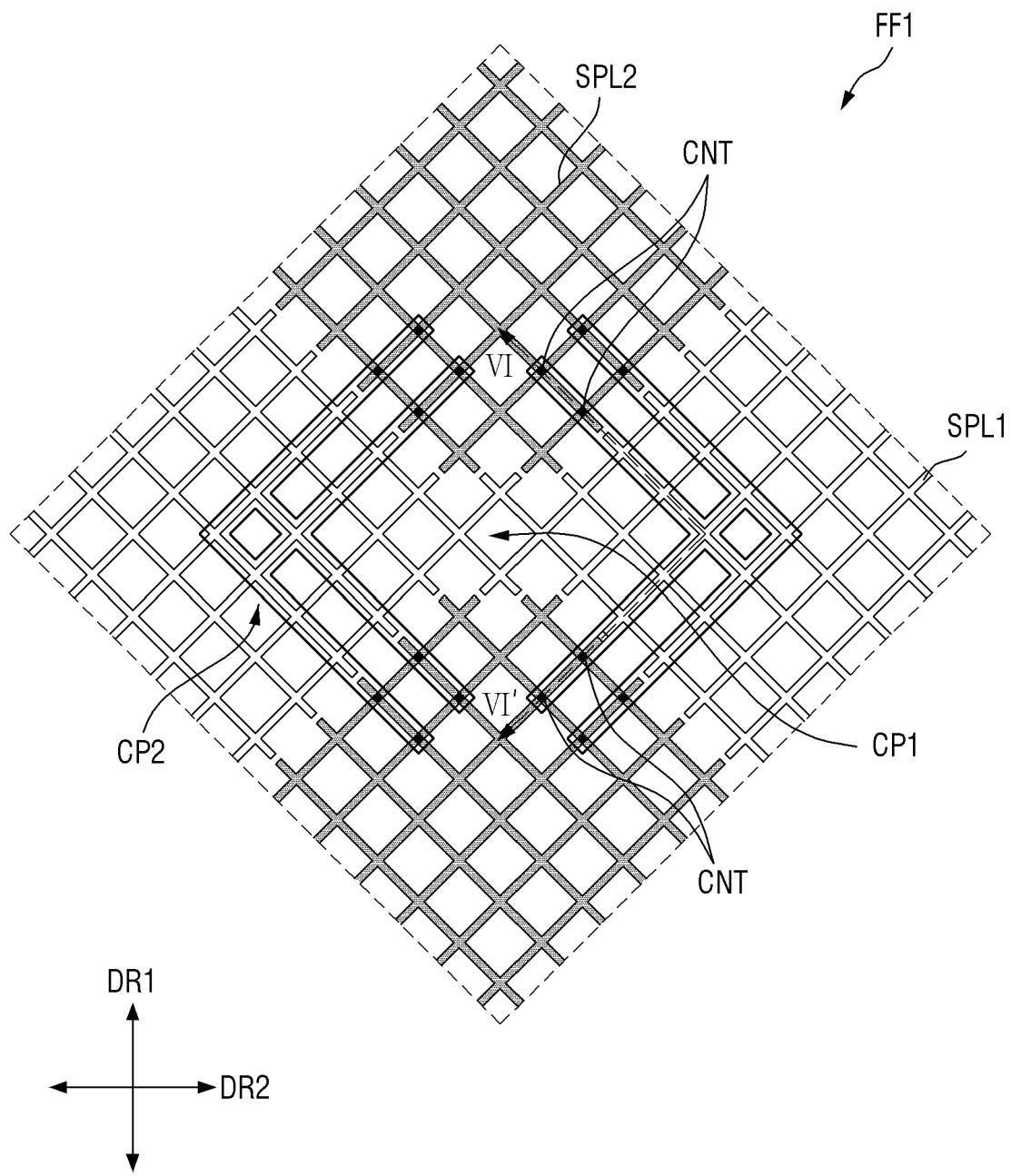
FIG. 7 is an enlarged plan view of area FF1 of FIG. 5.
Figure 8:
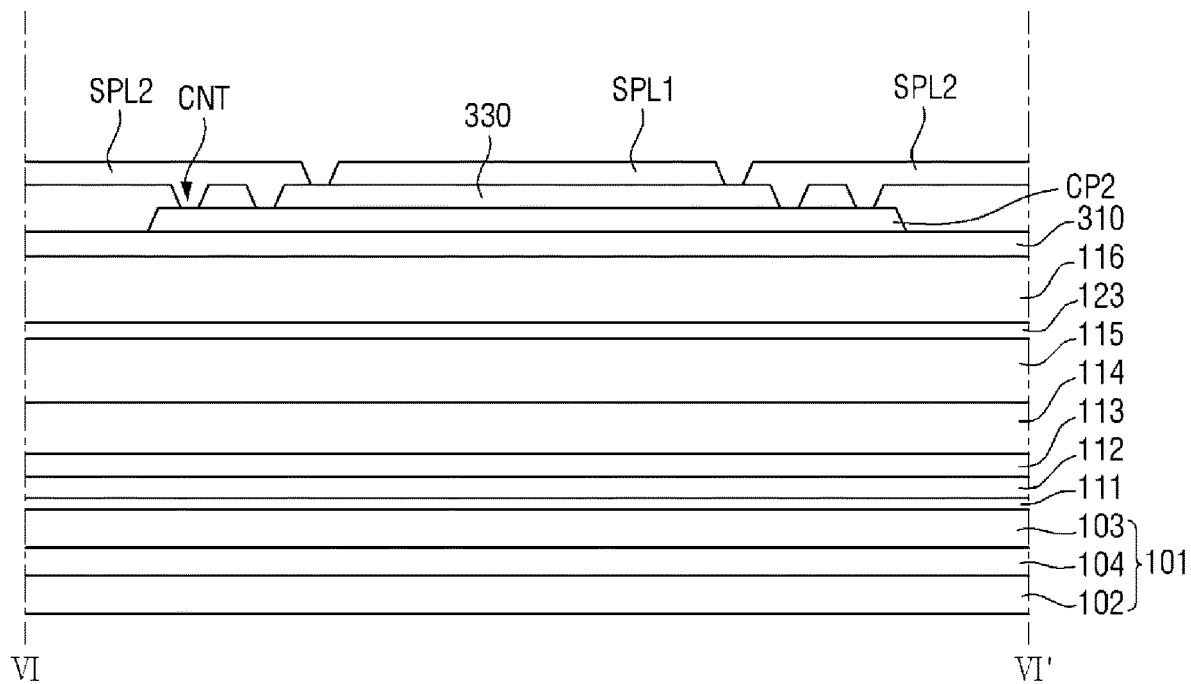
FIG. 8 is a cross-sectional view taken along line VI-VI' of FIG. 7.
Figure 9:
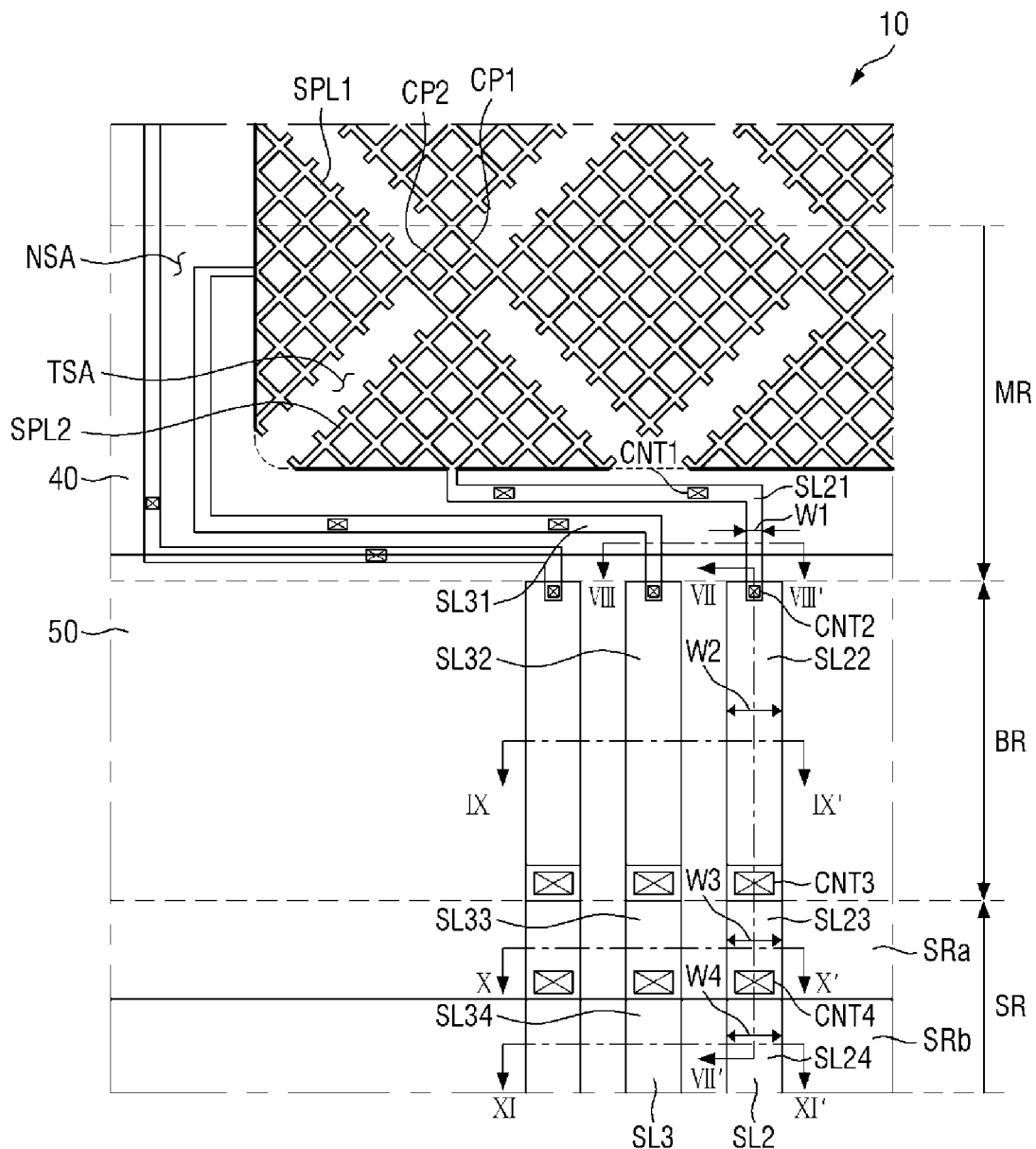
FIG. 9 is a view showing a layout of signal lines arranged in a main region, a bending region, and a subsidiary region.
Figure 10:
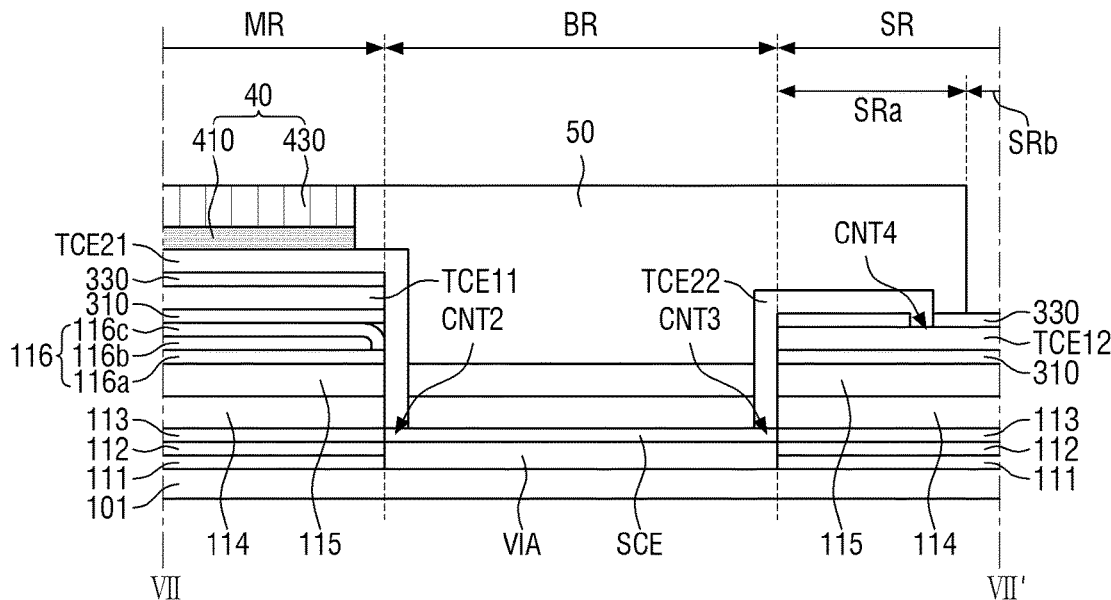
FIG. 10 is a cross-sectional view taken along line VII-VII' of FIG. 9.
Figure 11:
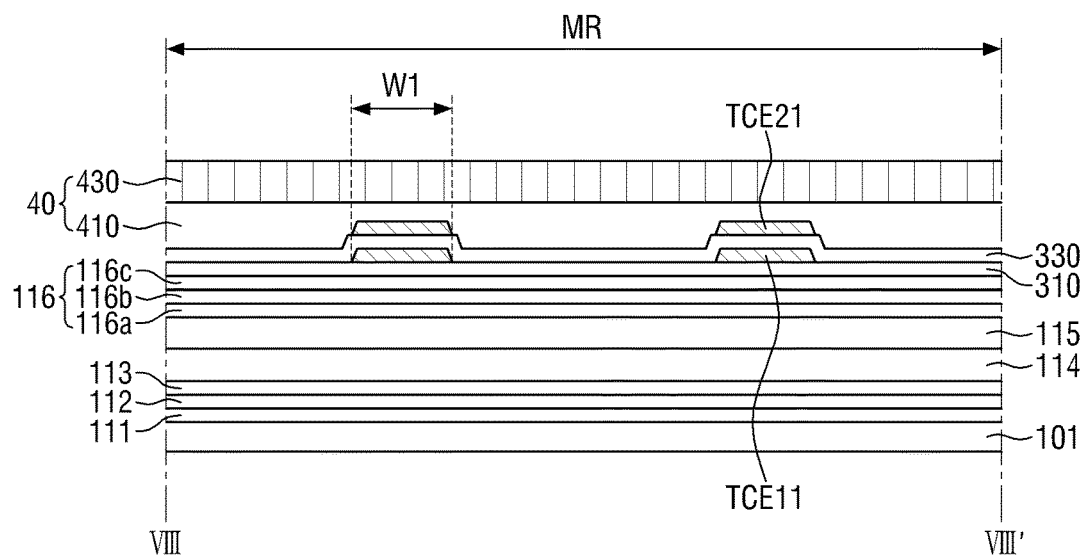
FIG. 11 is a cross-sectional view taken along line VIII-VIII' of FIG. 9.
Figure 12:
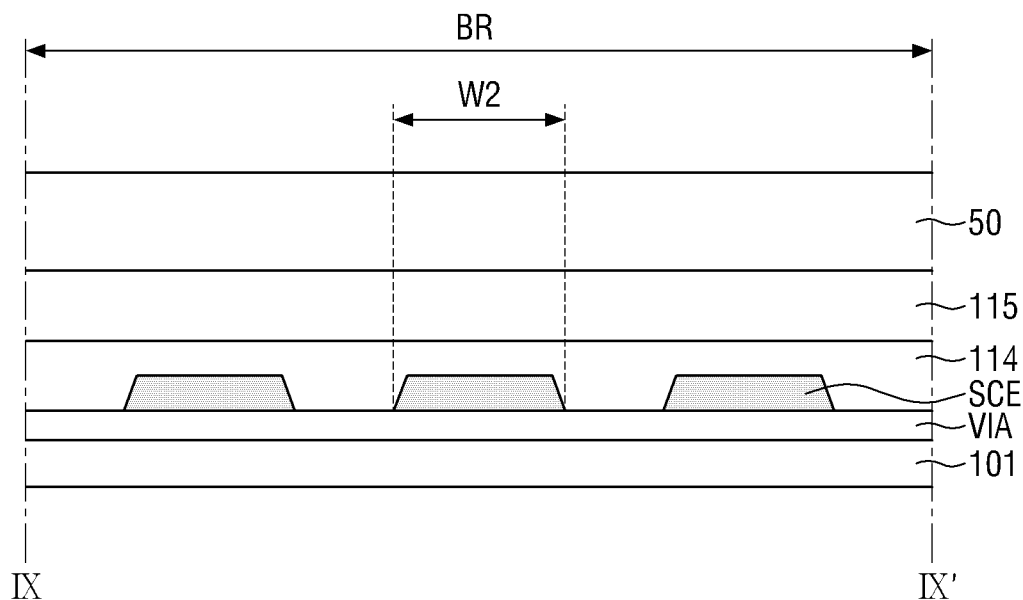
FIG. 12 is a cross-sectional view taken along line IX-IX' of FIG. 9.
Figure 13:
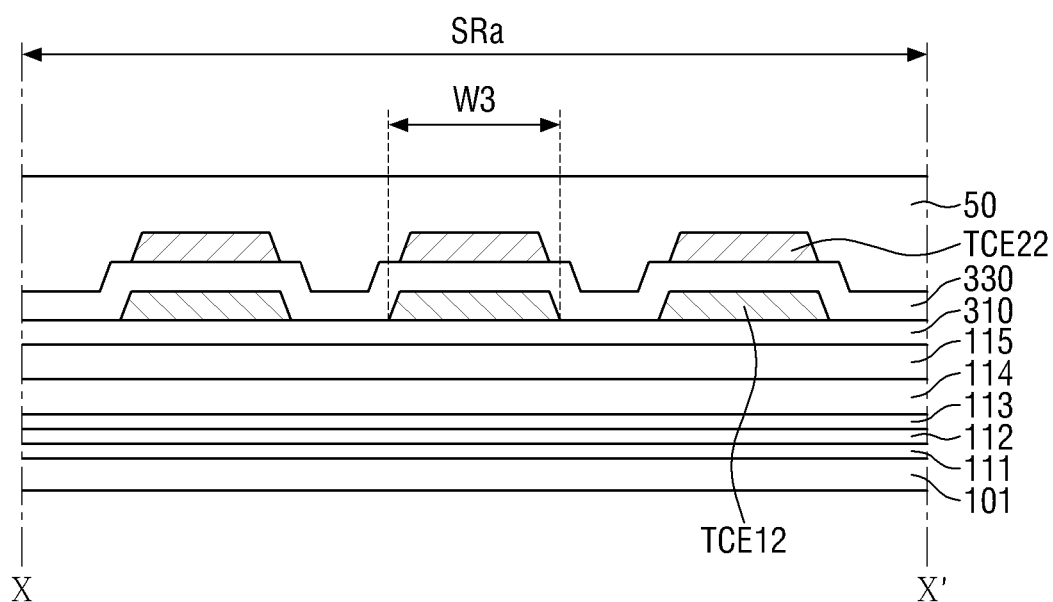
FIG. 13 is a cross-sectional view taken along line X-X' of FIG. 9.
Figure 14:
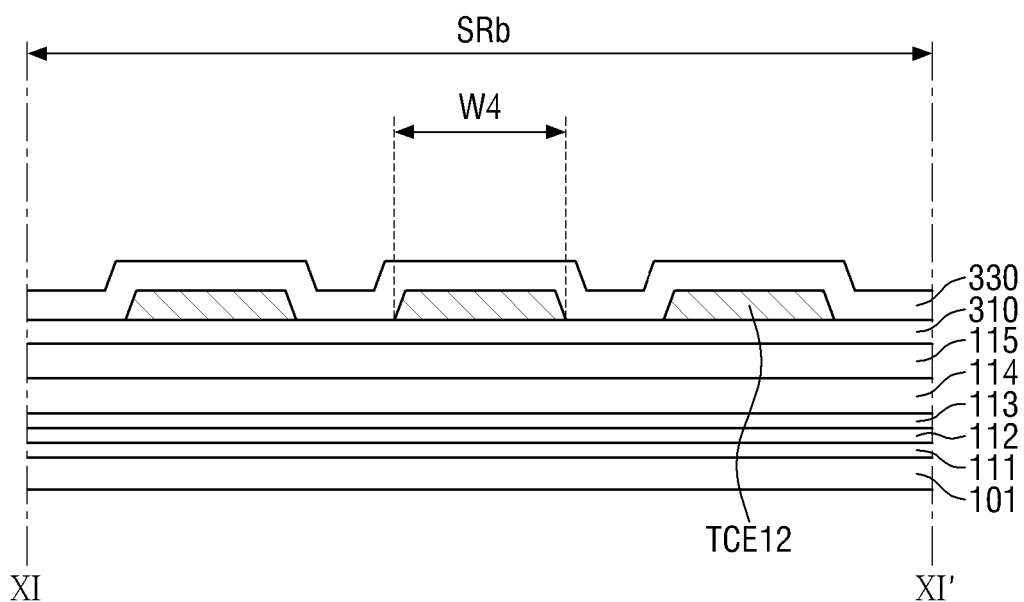
FIG. 14 is a cross-sectional view taken along line XI-XI' of FIG. 9.

FIG. 4 is a cross-sectional view of a main region of a display device according to an exemplary embodiment. FIG. 5 is a plan view showing the layout of a display member and a touch member of a display device according to an exemplary embodiment. FIG. 6 shows cross-sectional views taken along line IV-IV' and V-V of FIG. 5, respectively. FIG. 7 is an enlarged plan view of area FF1 of FIG. 5. FIG. 8 is a cross-sectional view taken along line VI-VI' of FIG. 7. FIG. 9 is a view showing the layout of signal lines arranged in a main region, a bending region, and a subsidiary region. FIG. 10 is a cross-sectional view taken along line VII-VII' of FIG. 9. FIG. 11 is a cross-sectional view taken along line VIII-VIII' of FIG. 9. FIG. 12 is a cross-sectional view taken along line IX-IX' of FIG. 9. FIG. 13 is a cross-sectional view taken along line X-X' of FIG. 9. FIG. 14 is a cross-sectional view taken along line XI-XI' of FIG. 9.

Referring to FIGS. 4 to 14, the substrate unit 101 may include a first support substrate 102, a second support substrate 103 disposed above the first support substrate 102, and a barrier layer 104 disposed between the first support substrate 102 and the second support substrate 103. The first support substrate 102 and the second support substrate 103 may be flexible substrates as described above. For example, each of the first support substrate 102 and the second support substrate 103 may be a film substrate including a polymer organic substance or a plastic substrate. For example, the first support substrate 102 and the second support substrate 103 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the substrate unit 101 may include fiber glass reinforced plastic (FRP).

The barrier layer 104 may be disposed between the first support substrate 102 and the second support substrate 103 to couple them together, and may cause the first and second support substrates 102 and 103 to be flat, which include an organic material. The barrier layer 104 may be made of an inorganic material.

A buffer layer 111 is disposed on the substrate unit 101. The buffer layer 111 may be disposed on the second support substrate 103. The buffer layer 111 smoothens the surface of the substrate unit 101 and prevents permeation of moisture or external air. The buffer layer 111 may be an inorganic layer. The buffer layer 111 may have a single layer or multiple layers structure.

On the buffer layer 111, a plurality of thin-film transistors TR is disposed. The plurality of thin-film transistors TR may be driving thin-film transistors. At least one thin-film transistor TR may be disposed in each of the pixels. Each of the thin film transistors TR may include a semiconductor layer CH, a gate electrode GE, a source electrode SE, and a drain electrode DE.

More particularly, the semiconductor layer CH is disposed on the buffer layer 111. The semiconductor layer CH may include amorphous silicon, poly silicon, and an organic semiconductor. In another exemplary embodiment, the semiconductor layer CH may be an oxide semiconductor. The semiconductor layer CH may include a channel region, and a source region and a drain region, which are disposed on the sides of the channel region, respectively, and are doped with impurities.

A gate insulating layer 112 is disposed on the semiconductor layer CH. The gate insulating layer 112 may be an inorganic layer. The gate insulating layer 112 may have a single layer or multiple layers structure.

A first conductive layer DCL1 may be disposed on the gate insulating layer 112. The first conductive layer DCL1 may include the gate electrode GE. The first conductive layer DCL1 may further include a plurality of scan lines. The gate electrode GE may be connected to one of the plurality of scan lines.

The first conductive layer DCL1 may be made of a conductive metal material. For example, the first conductive layer DCL1 may include molybdenum (Mo), aluminum (Al), copper (Cu), and titanium (Ti). The first conductive layer DCL1 may have a single layer or multiple layers structure.

An interlayer dielectric layer 113 is disposed on the first conductive layer DCL1. The interlayer dielectric layer 113 may be an inorganic layer. The interlayer dielectric layer 113 may have a single layer or multiple layers structure.

A second conductive layer DCL2 may be disposed on the interlayer dielectric layer 113. The second conductive layer DCL2 may include the source electrode SE, the drain electrode DE, and the source connection electrode SCE. The second conductive layer DCL2 may further include a high-level voltage line, a low-level voltage line, and a plurality of data lines, without being limited thereto.

The source electrode SE and the drain electrode DE may be electrically connected to the source region and the drain region of the semiconductor layer CH, respectively, through a contact hole formed through the interlayer dielectric layer 113 and the gate insulating layer 112.

The source connection electrode SCE may be electrically connected to the thin film transistor of each pixel. The source connection electrode SCE may be electrically connected to the touch member 30 through a contact hole. The second conductive layer DCL2 is made of a conductive metal material. For example, the second conductive layer DCL2 may include aluminum (Al), copper (Cu), titanium (Ti), and molybdenum (Mo).

The display device 1 may further include a storage capacitor and a switching thin film transistor disposed on the substrate unit 101.

A protective layer 114 is disposed over the second conductive layer DCL2 and the interlayer dielectric layer 113. The protective layer 114 is disposed to cover a pixel circuitry including the thin-film transistor TR. The protective layer 114 may be a planarization layer. The planarization layer may include a material, such as acrylic and polyimide.

A plurality of first electrodes 121 may be disposed on the protective layer 114. The first electrodes 121 may be pixel electrodes each disposed in the respective pixels. In addition, each of the first electrodes 121 may be an anode electrode of an organic light-emitting diode.

The first electrode 121 may be electrically connected to the drain electrode DE or the source electrode SE disposed on the first substrate unit 101 through a via hole passing through the protective layer 114.

The first electrode 121 may include a material having a high work function. For example, the first electrode 121 may include indium-tin-oxide (ITO), indium-zinc-oxide (IZO), zinc oxide (ZnO), indium oxide ($In_2O_3$), and the like, which have a relatively high work function and are transparent. When the organic light-emitting display device is a top-emission organic light-emitting display device, the first electrode 121 may further include a reflective material, such as silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca), or a combination thereof, in addition to the above-listed conductive materials. Accordingly, the first electrodes 121 may have a single-layer structure including the above-listed conductive material and the reflective material, or may have a multi-layer structure, in which the single layers are stacked one over another.

A bank layer 115 is disposed over the first electrode 121. The bank layer 115 includes openings each exposing at least a part of the respective first electrodes 121. The bank layer 115 may include an organic material or an inorganic material. In an exemplary embodiment, the bank layer 115 may include a material, such as a photoresist, a polyimide resin, an acrylic resin, a silicon compound, and a polyacrylic resin.

The organic emission layer 122 is disposed on the first electrode 121 exposed by the bank layer 115. The organic emission layer 122 may be a color emissive layer emitting a particular color. For example, the organic emission layer 122 may include a red emission layer 122_1 for emitting red light, a green emission layer 122_2 for emitting green light, and a blue emission layer 122_3 for emitting blue light. The color emissive layers may be disposed in the pixels, respectively.

In some exemplary embodiments, the organic emission layer 122 may be formed as a single piece, unlike that shown in FIG. 4. In particular, a single organic emission layer 122 may be shared by the pixels. The organic emission layer 122 may include a color emissive layer emitting light of a particular color. For example, the organic emission layer 122 may be a blue emission layer emitting blue light. In this case, wavelength conversion patterns may be further disposed above the organic emission layer 122 for converting the color of the light emitted from the organic emission layer 122.

A second electrode 123 is disposed on the organic emission layer 122. The second electrode 123 may be a common electrode extended across the pixels. In addition, the second electrode 123 may be a cathode electrode of an organic light-emitting diode.

The second electrode 123 may be made of a material having a low work function. The second electrode 123 may include Li, Ca, LiF/Ca, LiF/Al, Al, Mg, Ag, Pt, Pd, Ni, Au, Nd, Ir, Cr, BaF, Ba, or a compound or mixture thereof, e.g., a mixture of Ag and Mg. The second electrode 123 may further include an auxiliary electrode. The auxiliary electrode may include a layer formed by depositing the material described above, and depositing a transparent metal oxide, such as indium-tin-oxide (ITO), indium-zinc-oxide (IZO), zinc oxide (ZnO) and indium-tin-zinc-oxide (ITZO), on the layer.

When the display device 1 is a top-emission organic light-emitting diode display device, a thin conductive layer having a small work function may be formed as the second electrode 123, and a transparent conductive layer, such as indium-tin-oxide (ITO) layer, an indium-zinc-oxide (IZO) layer, a zinc oxide (ZnO) layer and an indium oxide ($In_2O_3$) layer may be formed thereon.

As described above, the first electrode 121, the organic emission layer 122, and the second electrode 123 may form a light-emitting element.

Although not shown in the drawings, a hole injection layer and/or a hole transport layer may be disposed between the first electrode 121 and the organic emission layer 122, and an electron transport layer and/or an electron injection layer may be disposed between the organic emissive layer and the second electrode 123.

An encapsulation layer 116 is disposed on the second electrode 123. The encapsulation layer 116 includes at least one inorganic layer and at least one organic layer. The at least one inorganic layer and the at least one organic layer may be stacked one over another. For example, the encapsulation layer 116 may be made up of multiple layers including a first inorganic encapsulation layer 116a, an organic encapsulation layer 116b, and a second inorganic encapsulation layer 116c, which are sequentially stacked one over another, as shown in FIG. 6. The first inorganic encapsulation layer 116a and the second inorganic encapsulation layer 116c may include at least one of silicon oxide ($SiO_x$), silicon nitride ($SiN_x$), and silicon oxynitride ($SiON_x$). The organic encapsulation layer 116b may include at least one of epoxy, acrylate, and urethane acrylate.

The touch member 30 is disposed on the encapsulation layer 116. The touch member 30 may be in direct contact with the upper surface of the second inorganic encapsulation layer 116c of the encapsulation layer 116.

The touch member 30 includes a touch sensing area TSA and a non-sensing area NSA disposed around the touch sensing area TSA. As will be described in more detail later, sensing electrodes and bridge connection electrodes connecting the sensing electrodes may be disposed in the touch sensing area TSA, and a plurality of signal lines connected to the sensing electrodes may be disposed in the non-sensing area NSA.

The touch member 30 may include a first touch insulating layer 310, a first touch conductive layer TCL1 disposed on the first touch insulating layer 310, a second touch insulating layer 330 disposed on the first touch conductive layer TCL1, and a second touch conductive layer TCL2 disposed on the second touch insulating layer 330.

The first touch insulating layer 310 may be disposed on the second inorganic encapsulation layer 116c. The first touch insulating layer 310 may be disposed directly on the second inorganic encapsulation layer 116c. The first touch insulating layer 310 may insulate the first touch conductive layer TCL1 from the plurality of conductive layers of the display member 20.

In an exemplary embodiment, the first touch insulating layer 310 may include an inorganic insulating material. The inorganic material may include at least one of silicon oxide ($SiO_x$), silicon nitride ($SiN_x$), and silicon oxynitride ($SiON_x$). In another exemplary embodiment, the first touch insulating layer 310 may include an organic material. The organic material may include at least one of an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The first touch conductive layer TCL1 may be disposed on the first touch insulating layer 310. The first touch conductive layer TCL1 may include second touch bridge electrodes CP2 electrically connecting adjacent ones of the second sensing electrodes IE2_1 to IE2_4. The second touch bridge electrodes CP2 may be spaced apart from one another. The second touch bridge electrodes CP2 spaced apart from one another may partially expose the upper surface of the first touch insulating layer 310. The touch bridge electrodes of the first touch conductive layer TCL1 may overlap the black matrix and the bank layer 115. Accordingly, it is possible to hide the electrodes from a user. The first touch conductive layer TCL1 may further include a (1-1) touch connection electrode TCE11 disposed in the main region MR and a (1-2) touch connection electrode TCE12 disposed in the subsidiary region SR.

The second touch insulating layer 330 may be disposed on the first touch conductive layer TCL1. The second touch insulating layer 330 may be in direct contact with the exposed upper surface of the first touch insulating layer 310. The second touch insulating layer 330 may insulate the first touch conductive layer TCL1 from the second touch conductive layer TCL2. The second touch insulating layer 330 may be made of an inorganic insulating material. The second touch insulating layer 330 may include at least one the materials that may form the first touch insulating layer 310 described above.

The second touch conductive layer TCL2 may be disposed on the second touch insulating layer 330. The second touch conductive layer TCL2 may include a plurality of first sensing electrodes IE_1 to IE_8 and a plurality of second sensing electrodes IE2_1 to IE2_4, and may further include first touch bridge electrodes CP1 for electrically connecting adjacent ones of the first sensing electrodes IE_1 to IE_8. The second touch conductive layer TCL2 may further include a (2-1) touch connection electrode TCE21 disposed in the main region MR and a (2-2) touch connection electrode TCE22 disposed in the subsidiary region SR.

The plurality of first sensing electrodes IE1_1 to IE1_8 may be extended in the second direction DR2 and may be arranged in the first direction DR1. The plurality of second sensing electrodes IE2_1 to IE2_4 may be extended in the first direction DR1 and may be arranged in the second direction DR2.

Each of the plurality of first sensing electrodes IE1-1 to IE1-8 may include a plurality of first sensing lines SPL1 having a mesh shape. The regions defined by the plurality of first sensing lines SPL1 may overlap the organic light-emitting layers 122_1 to 122_3 disposed in the pixels, respectively.

Each of the plurality of second sensing electrodes IE2-1 to IE2-4 may include a plurality of second sensing lines SPL2 having a mesh shape. Likewise, the regions defined by the plurality of second sensing lines SPL2 may overlap the organic emission layers 122_1 to 122_3 disposed in the pixels, respectively. The regions defined by the plurality of first sensing lines SPL1 and the regions defined by the plurality of second sensing lines SPL2 may have a diamond shape, for example. As used herein, the term a diamond shape encompasses not only a substantially diamond shape but also a simple geometric shape have an approximate diamond shape depending on different processing conditions and the arrangement of the sensing lines.

The first sensing lines SPL1 are electrically insulated from the second sensing lines SPL2. In an exemplary embodiment, the plurality of first sensing lines SPL1 may be disposed on the same layer as the plurality of second sensing lines SPL2. In this case, the plurality of first touch bridge electrodes CP1 and the plurality of second touch bridge electrodes CP2 are disposed in different layers, and thus, are electrically insulated from each other.

The touch bridge electrodes and the sensing electrodes of the second touch conductive layer TCL2 may overlap the black matrix and the bank layer 115. Accordingly, it is possible to hide the electrodes from a user.

In some exemplary embodiments, the electrodes of the first touch conductive layer TCL1 described above may be disposed in the second touch conductive layer TCL2, and vice versa.

In some exemplary embodiments, the first touch conductive layer TCL1 may include first sensing electrodes IE1_1 to IE1_8 and a first touch bridge electrode CP1, and the second touch conductive layer TCL2 may include second sensing electrode IE2_1 to IE2_4 and a second touch bridge electrode CP2.

In some exemplary embodiments, the first touch conductive layer TCL1 may include second sensing electrodes IE2_1 to IE2_4 and a second touch bridge electrode CP2, and the second touch conductive layer TCL2 may include first sensing electrode IE1_1 to IE1_8 and a first touch bridge electrode CP1.

Hereinafter, the first touch conductive layer TCL1 will be described as including the second touch bridge electrodes CP2 that electrically connect adjacent ones of the second sensing electrodes IE2_1 to IE2_4, and the second touch conductive layer TCL2 will be described as including the first sensing electrodes IE1_1 to IE1_8 and the second sensing electrodes IE2_1 to IE2_4, as well as the first touch bridge electrodes CP1 that electrically connect the adjacent ones of the first sensing electrodes IE1_1 to IE1_8, according to an exemplary embodiment.

Each of the first touch conductive layer TCL1 and the second touch conductive layer TCL2 may include a conductive material. The conductive material may include a low-resistance metal, such as silver (Ag), aluminum (Al), chromium (Cr) and nickel (Ni), or a conductive nano material, such as a silver nanowire and a carbon nanotube.

The (1-1) touch connection electrode TCE11 may overlap the (2-1) touch connection electrode TCE21 in the thickness direction. The (2-1) touch connection electrode TCE21 may be electrically connected to the source connection electrode SCE of the second conductive layer DCL2 through a second contact hole CNT2, and the (1-2) touch connection electrode TCE12 may overlap the (2-2) touch connection electrode TCE22 in the thickness direction. The (2-2) touch connection electrode TCE22 may be electrically connected to the source connection electrode SCE of the second conductive layer DCL2 through a third contact hole CNT3.

The polarization member 40 may be disposed on the second touch conductive layer TCL2 and the second touch insulating layer 330. According to an exemplary embodiment, the polarization member 40 may be a polarization film. The polarization member 40 may include a polarizing layer 430 and a polarizing adhesive layer 410 disposed on the polarizing layer 430. The polarizing adhesive layer 410 may include a polymer material that is sorted into a silicone polymer, a urethane polymer, an SU polymer having silicone-urethane hybrid structure, an acrylic polymer, an isocyanate polymer, a polyvinyl alcohol polymer, a gelatin polymer, a vinyl polymer, a latex polymer, polyester polymer, water-based polyester polymer, etc.

The polarizing adhesive layer 410 may be in contact with the second touch conductive layer TCL2 and the upper surface of the second touch insulating layer 330 exposed by the second touch conductive layer TCL2. As described above, outside air or moisture may permeate into the exposed second touch conductive layer TCL2, which may cause corrosion of the second touch conductive layer TCL2. As such, in the display panel 10 according to an exemplary embodiment, the polarization member 40 is disposed in the main region MR and the polarizing adhesive layer 410 of the polarization member 40 is in direct contact with the second touch conductive layer TCL2 for protection. As such, it is possible to prevent corrosion of the second touch conductive layer TCL2 due to permeation of outside air or moisture.

Referring to FIG. 5, the touch member 30 may further include a second signal line SL2 and a third signal line SL3 that are connected to the first sensing electrodes IE1_1 to IE1_8 and the second sensing electrodes IE2_1 to IE2_4, and pass through the first pad area PA1 and the second pad area PA2. The display member 20 may include a first signal line SL1 that is connected to each of pixels in the display area, and passes through the first and second pad areas PA1 and PA2.

As shown in FIG. 5, in the touch member 30 according to the illustrated exemplary embodiment, the first sensing electrodes IE1_1 to IE1_4 may be connected to a fourth signal line SL4 disposed on the right side to be connected to the pad areas PA1 and PA2. The first sensing electrodes IE1_5 to IE1_8 may be connected to a third signal lines SL3 disposed on the left side to be connected to the pad areas PA1 and PA2. The second sensing electrodes IE2_1 to IE2_4 may be connected to a second signal line SL2 disposed on the lower side to be connected to the pad areas PA1 and PA2.

Each of the first signal line SL1 to the third signal line SL3 may be extended across the main region MR, the bending region BR, and the subsidiary region SR.

Referring to FIG. 9, the second signal line SL2 may include a first signal line part SL21 disposed in the main region MR, a second signal line part SL22 disposed in the bending region BR, and a third signal line part SL23 and a fourth signal line part SL24 disposed in the subsidiary region SR. The first signal line part SL21 may be connected to the above-described sensing electrodes, and the fourth signal line part SL24 may be connected to touch pads. The second signal line part SL22 may be disposed between the first signal line part SL21 and the fourth signal line part SL24, and the third signal line part SL23 may be disposed between the second signal line part SL22 and the second signal line part SL22. The first signal line part SL21 to the fourth signal line part SL24 are connected with each other as a single piece.

According to an exemplary embodiment, the number of stacked touch conductive layers of the first signal line part SL21 may be different from the number of stacked touch conductive layers of the fourth signal line part SL24. The number of touch conductive layers included in the first signal line part SL21 may be greater than the number of touch conductive layers included in the fourth signal line part SL24.

The first signal line part SL21 may include the (1-1) touch connection electrode TCE11 of the first touch conductive layer TCL1 and the (2-1) touch connection electrode TCE21 of the second touch conductive layer TCL2. The (2-1) touch connection electrode TCE21 may be disposed on the (1-1) touch connection electrode TCE11. The (1-1) touch connection electrode TCE11 and the (2-1) touch connection electrode TCE21 may overlap each other in the thickness direction. The (1-1) touch connection electrode TCE11 and the (2-1) touch connection electrode TCE21 may be electrically connected to each other through a first contact hole CNT1. As the (1-1) touch connection electrode TCE11 and the (2-1) touch connection electrode TCE21 of the first signal line part SL21, which overlap each other in the thickness direction, are electrically connected to each other through the first contact hole CNT1, the line resistance can be lowered.

The second signal line part SL22 may include the source connection electrode SCE of the second conductive layer DCL2. In some exemplary embodiments, the second signal line part SL22 may not include the source connection electrode SCE, but may include a gate connection electrode of the first conductive layer DCL1. In the following description, the second signal line part SL22 will be described as including the source connection electrode SCE of the second conductive layer DCL2. The second signal line part SL22 may be an element included in the touch member 30 (see FIG. 3). In particular, although the source connection electrode SCE or the gate connection electrode forming the second signal line part SL22 is disposed on the same layer as the second conductive layer DCL2 of the display member 20 (see FIG. 3) or as the first conductive layer DCL1, the source connection electrode SCE or the gate connection electrode may be regarded as forming the signal line part SL22 of the touch member 30.

The source connection electrode SCE may be electrically connected to the (2-1) touch connection electrode TCE21 through the second contact hole CNT2. The second contact hole CNT2 may be located in the bending region BR. In particular, the (2-1) touch connection electrode TCE21 may be further extended to the bending region BR than the (1-1) touch connection electrode TCE11 to be electrically connected to the source connection electrode SCE. The (2-1) touch connection electrode TCE21 further extended to the bending region BR may be in contact with the exposed side surface of the (1-1) touch connection electrode TCE11.

The source connection electrode SCE may be electrically connected to the (2-2) touch connection electrode TCE22 through the third contact hole CNT3, which will be described in more detail later. The third contact hole CNT3 may be located in the bending region BR.

The third signal line part SL23 may include the (1-2) touch connection electrode TCE12 of the first touch conductive layer TCL1 and the (2-2) touch connection electrode TCE22 of the second touch conductive layer TCL2. The (1-2) touch connection electrode TCE12 and the (2-2) touch connection electrode TCE22 may overlap each other in the thickness direction. The (1-2) touch connection electrode TCE12 and the (2-2) touch connection electrode TCE22 may be in electrical contact, like the first signal line part SL21, but the inventive concepts are not limited thereto.

As described above, the (2-2) touch connection electrode TCE22 may be electrically connected to the source connection electrode SCE through the third contact hole CNT3. In addition, the (2-2) touch connection electrode TCE22 may be electrically connected to the (1-2) touch connection electrode TCE12 through a fourth contact hole CNT4. As such, the (2-2) touch connection electrode TCE22 may be further extend to the bending region BR than the (1-2) touch connection electrode TCE12. The (2-2) touch connection electrode TCE22 further extended to the bending region BR may be in contact with the exposed side surface of the (1-2) touch connection electrode TCE12. The fourth contact hole CNT4 may be located in the subsidiary region SR, and thus, may be located farther from the bending region BR than the third contact hole CNT3 is.

The fourth signal line part SL24 may include the (1-2) touch connection electrode TCE12 of the first touch conductive layer TCL1 described above. In particular, the (1-2) touch connection electrode TCE12 may be disposed across the third and fourth signal line parts SL23 and SL24. Although the fourth signal line part SL24 may be connected to a pad of the touch member 30, a contact line may be further disposed on a different layer between the fourth signal line part SL24 and the pad of the touch member 30 to be connected to the pad of the touch member 30.

Referring to FIGS. 9 and 10, as described above, the first signal line part SL21 may include a (1-1) touch connection electrode TCE11 and a (2-1) touch connection electrode TCE21 overlapping each other, the second signal line part SL22 may include the source connection electrode SCE, the third signal line part SL23 may include the (1-2) touch connection electrode TCE12 and the (2-2) touch connection electrode TCE22 overlapping each other, and the fourth signal line part SL24 may include the (1-2) touch connection electrode TCE21.

Referring to FIG. 9, the third signal line SL3 may include a first signal line part SL31 disposed in the main region MR, a second signal line part SL32 disposed in the bending region BR, and a third signal line part SL33 and a fourth signal line part SL34 disposed in the subsidiary region SR. The first signal line part SL31 may be connected to the above-described sensing electrodes, and the fourth signal line part SL34 may be connected to the touch pads. The second signal line part SL32 may be disposed between the first signal line part SL31 and the fourth signal line part SL34, and the third signal line part SL33 may be disposed between the second signal line part SL32 and the second signal line part SL32. The first signal line part SL31 to the fourth signal line part SL34 are connected with one another as a single piece. The first signal line part SL31 to the fourth signal line part SL34 of the third signal line SL3 may be associated with a first signal line part SL21 to a fourth signal line part of the second signal line SL2, respectively. Accordingly, the first signal line part SL31 to the fourth signal line part SL34 of the third signal line SL3 may be substantially identical to the first signal line part SL21 to the fourth signal line part of the second signal line SL2, respectively. As such, repeated descriptions thereof will be omitted. In addition, the first signal line part SL31 to the fourth signal line part SL34 of the third signal line SL3 may be substantially identical to the first signal line part SL21 to the fourth signal line part of the second signal line SL2, respectively; and thus, repeated descriptions thereof will be omitted.

Referring back to FIGS. 5 and 6, the first and second signal lines SL3 and SL4 positioned on the left side and the right side of the active area AAR in FIG. 5 may have a stack structure, in which the (1-1) touch connection electrode TCE11 and the (2-1) touch connection electrode TCE21 are stacked. More particularly, the plurality of (1-1) touch connection electrodes TCE11 may be disposed on the first touch insulating layer 310, the second touch insulating layer 330 may be disposed on the plurality of (1-1) touch connection electrodes TCE11, and the plurality of (2-1) touch connection electrode TCE21 may be disposed on the second touch insulating layer 330.

Referring to FIG. 7, as described above, the plurality of second sensing lines SPL2 of the plurality of second sensing electrodes IE2-1 to IE2-4 may be electrically connected by the second connection electrodes CP2, and the plurality of first sensing lines SPL1 of the plurality of first sensing electrodes IE1-1 to IE1-8 may be electrically connected by the first connection electrodes CP1.

Referring to FIG. 8, the second sensing lines SPL2 may be electrically connected to the second connection electrodes CP2 disposed between the second touch insulating layer 330 and the first touch insulating layer 310 through contact holes CNT penetrating through the second touch insulating layer 330.

One side surface of the polarizing layer 430 and one side surface of the polarizing adhesive layer 410 of the polarization member 40 may be aligned in the thickness direction. The polarization member 40 can substantially cover and protect the upper surface of the (2-1) touch connection electrode TCE21. The polarization member 40 may expose a part of the upper surface of the (2-1) touch connection electrode TCE21.

The inorganic layers of the display member 20 may not be disposed in the bending region BR. In particular, the buffer layer 111, the gate insulating layer 112, and the interlayer dielectric layer 113 of the display member 20 may include an opening formed in the bending region BR, by which the upper surface of the substrate unit 101 is exposed. A via layer VIA may be disposed in the bending region BR of the substrate unit 101. The via layer VIA may include an organic insulating material. The via layer VIA may include at least one of the materials that may form the protective layer 114 as described above. The via layer VIA may be in contact with the exposed side surfaces of the buffer layer 111, the gate insulating layer 112, and the like.

The source connection electrode SCE of the second conductive layer DCL2 described above may be disposed on the via layer VIA in the bending region BR. The source connection electrode SCE may be located in the bending region BR. The source connection electrode SCE may be electrically connected to the (2-1) touch connection electrode TCE21 and the (2-2) touch connection electrode T22 through the second contact hole CNT2 and the third contact hole CNT3 in the bending region BR, respectively. The second contact hole CNT2 and the third contact hole CNT3 may penetrate the encapsulation layer 116, the bank layer 115, and the protective layer 114 under the second touch conductive layer TCL2, and may be electrically connected to the source connection electrode SCE of the second conductive layer DCL2.

The bending protective layer 50 may be disposed in the opening. The bending protective layer 50 can cover the bending region BR of the display panel 10 to protect the substrate unit 101, and can also relieve bending stress when the display device 1 is bent.

The bending protective layer 50 may be in direct contact with the exposed side surface of the (2-1) touch connection electrode TCE21 and the exposed side surface of the (2-2) touch connection electrode TCE22 of the second touch conductive layer TCL2. The bending protective layer 50 may also be disposed on the exposed upper surface of the (2-1) touch connection electrode TCE21 and the exposed upper surface of the (2-2) touch connection electrode TCE22, to protect the upper surface and side surface of the (2-1) touch connection electrode TCE21 and the upper surface and side surface of the (2-2) touch connection electrode TCE22 from outside air or moisture. The bending protective layer 50 may be in contact with the second touch insulating layer 330 overlapping with the fourth signal line part SL24, without being limited thereto.

The subsidiary region SR may include a first subsidiary region SRa, in which the bending protective layer 50 is disposed, and a second subsidiary region SRb, in which the bending protective layer 50 is not disposed and the upper surface of the second touch insulating layer 330 is exposed. In the first subsidiary region SRa, the upper surface of the (2-2) touch connection electrode TCE22 may be covered by the bending protective layer 50.

The bending protective layer 50 may include an organic insulating material. The organic insulating material may be, but is not limited to, an organic resin.

Further, as described above, the side surface of the polarization member 40 may be in contact with the side surface of the bending protective layer 50. More particularly, no spacing is formed between the side surface of the polarization member 40 and the side surface of the bending protective layer 50.

In the main region MR, the polarization member 40 is disposed on the touch member 30, and thus, the exposed second touch conductive layer TCL2 is covered by the polarization member 40. However, in the subsidiary region SR, the second touch conductive layer TCL2 may be exposed to the outside, and thus, is exposed to outside air or moisture. As such, in the touch member 30 according to the illustrated exemplary embodiment, unlike in the main region MR, the second touch insulating layer 330 is formed in the subsidiary region SR, such as in the fourth signal line part SL24, the first touch conductive layer TCL1, e.g., the (1-2) touch connection electrode TCE12, such that the first touch conductive layer TCL1 is prevented from being exposed. In the third signal line part SL23, although the (2-2) touch connection electrode TCE22 is disposed above the (1-2) touch connection electrode TCE12 in order to connect the source connection electrode SCE and the (1-2) touch connection electrode TCE12, the bending protective layer 50 is disposed entirely above the third signal line part SL23 to cover and protect the (2-2) touch connection electrode TCE22, as described above. Accordingly, the (2-2) touch connection electrode TCE22 may be prevented from being exposed to outside air or moisture.

As described above, while the first signal line part SL21 may include two conductive layers electrically connected to each other, the fourth signal line part SL24 may include a single conductive layer and extend toward the pad of the touch member 30. In this manner, there may be a difference in electrically resistance. In general, the electrical resistance is inversely proportional to the area. As such, the electrical resistance may be increased since the area of the fourth signal line part SL24 is smaller than the area of the first signal line part SL21. Accordingly, in the touch member 30 according to the illustrated exemplary embodiment, it is possible to suppress an increase in the electrical resistance that may be caused by the area of the fourth signal line part SL24 as the width of the first signal line part SL21 is different from the width of the fourth signal line part SL24. More particularly, referring back to FIG. 9, the first signal line part SL21 may have a first width W1, and the fourth signal line part SL24 may have a fourth width W4. The width W4 may be greater than the first width W1. While the non-sensing area NSA located at the left and right sides of the touch sensing area TSA should have a small width of the signal line part in order to reduce the bezel width, the non-sensing area NSA located on the lower side of the touch sensing area TSA can have a relatively larger area, and thus, the space for the signal line part can be easily secured. As such, the fourth signal line part SL24 can be formed to have a greater width than that of the first signal line part SL21.

The second signal line part SL22 may have a second width W2, and the third signal line part SL23 may have a third width W3. The second width W2 and the third width W3 may be greater than the first width W1 and equal to the fourth width W4, without being limited thereto.

Referring to FIG. 11, the polarizing adhesive layer 410 of the polarization member 40 may cover the upper surface as well as the side surfaces of the (2-1) touch connection electrode TCE21 of the first signal line part SL21. For example, the polarizing adhesive layer 410 may be in contact with the upper surface and the side surfaces of the (2-1) touch connection electrodes TCE21.

Referring to FIG. 12, the bending protective layer 50 may cover the upper surface and the side surfaces of the source connection electrode SCE of the second signal line part SL22. For example, the bending protective layer 50 may be in contact with the upper surface and the side surfaces of the source connection electrode SCE.

Referring to FIG. 13, the bending protective layer 50 may cover the upper surface and the side surfaces of the (2-2) touch connection electrode TCE22 of the third signal line part SL23. For example, the bending protective layer 50 may be in contact with the upper surface and the side surfaces of the (2-2) touch connection electrodes TCE22.

According to the illustrated exemplary embodiment, the thickness of the display device 1 can be reduced by disposing the second touch conductive layer TCL2 at the top of the touch member 30 and eliminating a protective layer, such as an organic layer, that covers the second touch conductive layer TCL2, as described above.

In addition, as described above, outside air or moisture may permeate into the exposed second touch conductive layer TCL2 to cause corrosion of the second touch conductive layer TCL2. As such, in the display panel 10 according to the illustrated exemplary embodiment, the polarization member 40 is disposed in the main region MR and the bending protective layer 50 is disposed in the bending region BR, so that the exposed second touch conductive layer TCL2 may be covered and protected. In addition, in the subsidiary region SR, in which the second touch conductive layer TCL2 is not disposed, the second touch insulating layer 330 covers the second touch conductive layer TCL2 for protection. In this manner, it is possible to prevent the exposed conductive layers of the touch member 30 from being corroded by permeation of the outside air or moisture.

On the other hand, as described above, no spacing may be formed between the polarization member 40 and the bending protective layer 50 in order to cover and protect the second touch conductive layer TCL2. Accordingly, the bending protective layer 50 may be formed by depositing the constituent materials of the bending protective layer 50 up to a part of the upper surface of the polarization member 40 after the polarization member 40 is attached. This will be described in more detail with reference to FIGS. 15 and 16.

Figure 15:
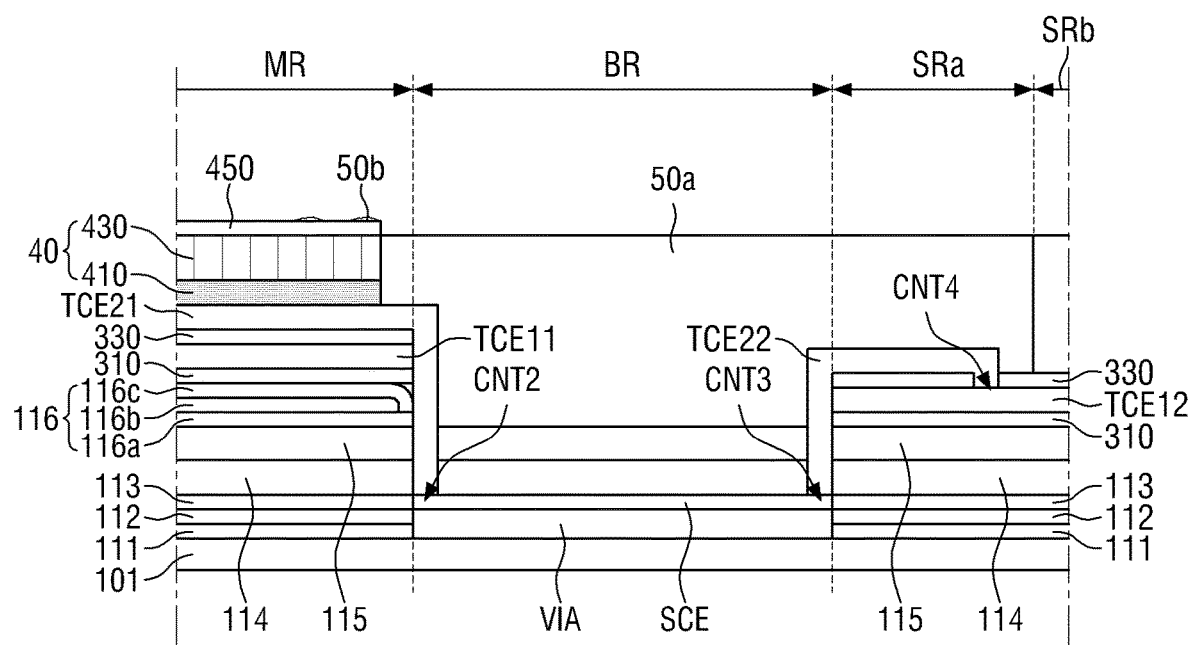
FIGS. 15 and 16 are cross-sectional views illustrating processing steps for forming a bending protective layer.
Figure 16:
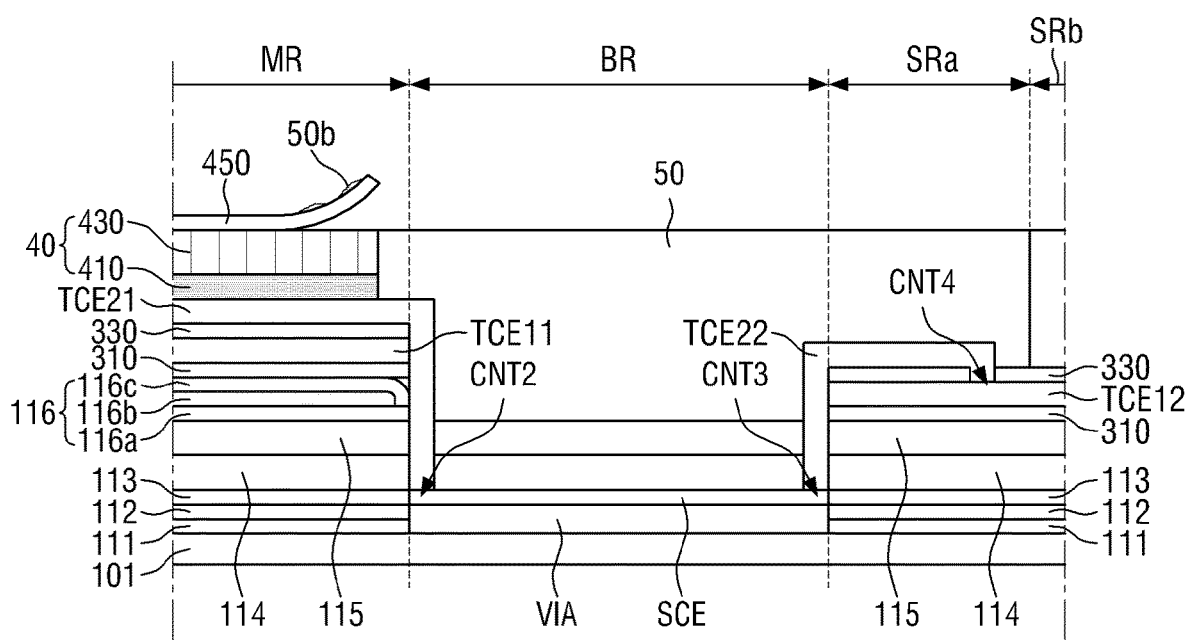

FIGS. 15 and 16 are cross-sectional views illustrating processing steps for forming a bending protective layer.

Referring to FIG. 15, after the polarization member 40 is attached, an organic material layer 50a is formed in the bending region BR, the main region MR, and a part of the subsidiary region SR. The organic material layer 50a may be formed by slit coating, spin coating, etc. The organic material layer 50a may contact the side surface of the polarizing adhesive layer 410 of the polarization member 40, the side surface of the polarizing layer 430, and the upper surface and side surfaces of the first touch connection electrode TCE1 of the second touch conductive layer TCL2, etc. During the process of applying the organic material layer 50a to the side surface of the polarization member 40, a part of the organic material 50b may be applied on the polarization member 40 as well.

Referring to FIG. 16, a release film 450 of the polarization member 40 is peeled off and removed. In this manner, the organic material 50b disposed on the polarization member 40 is removed together, and thus, the bending protective layer 50 and its constituent materials may not be remained on the upper surface of the polarization member 40. In addition, since the bending protective layer 50 is formed to contact with the entire side surface of the polarization member 40 as described above, no spacing may be formed between the bending protective layer 50 and the polarization member 40. Accordingly, the second touch conductive layer TCL2 is not exposed to outside air or moisture, and thus, it is possible to prevent the second touch conductive layer TCL2 from being corroded.

Hereinafter, display devices according to other exemplary embodiments will be described. In the following descriptions, the same or similar elements will be denoted by the same or similar reference numerals, and thus, repeated descriptions thereof will be omitted or briefly described.

Figure 17:
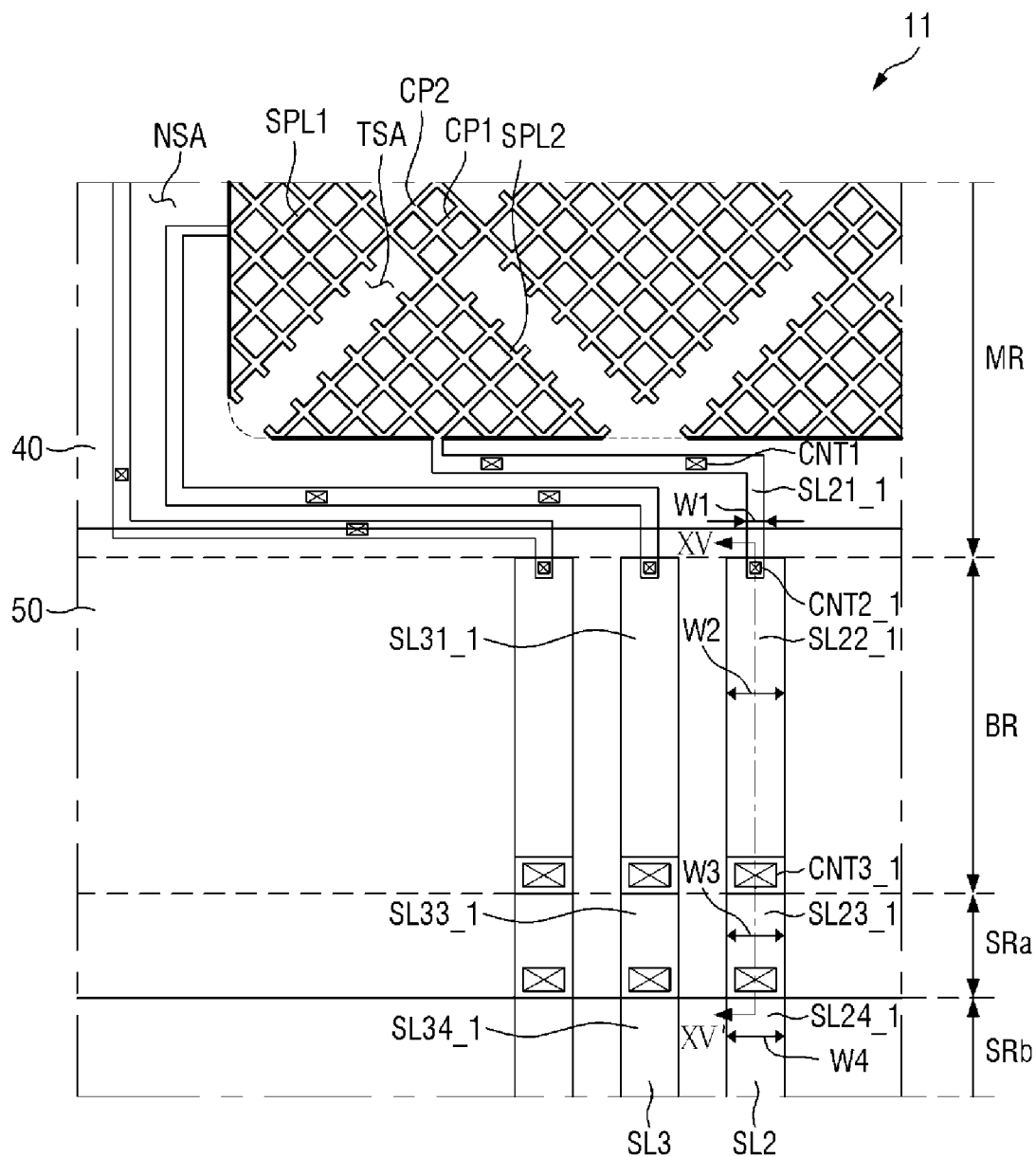
FIG. 17 is a view showing a layout of signal lines arranged in a main region, a bending region, and a subsidiary region according to another exemplary embodiment.
Figure 18:
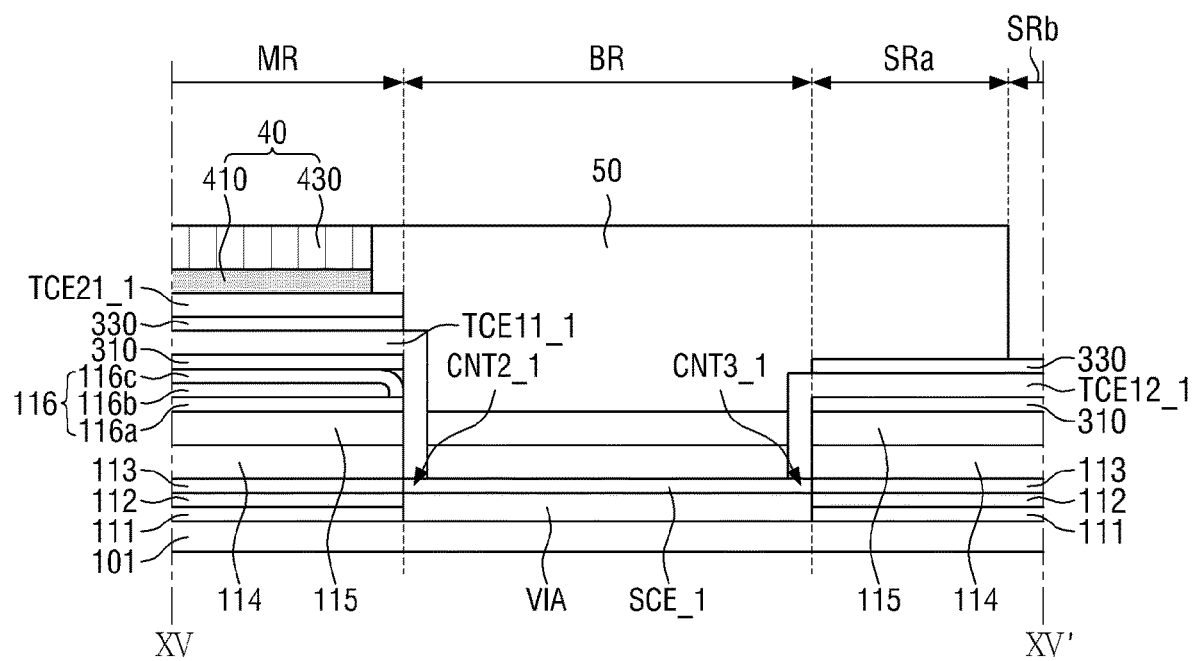
FIG. 18 is a cross-sectional view taken along line XV-XV' of FIG. 17.

FIG. 17 is a view showing a layout of signal lines arranged in a main region, a bending region, and a subsidiary region according to another exemplary embodiment. FIG. 18 is a cross-sectional view taken along line XV-XV' shown in FIG. 17.

A display panel 11 according to the illustrated exemplary embodiment shown in FIGS. 17 and 18 is substantially identical to the display panel described above, except that a (1-1) touch connection electrode TCE11_1 is electrically directly connected to a source connection electrode SCE_1 through a second contact hole CNT2_1 and that a (1-2) touch connection electrode TCE12_1 is electrically directly connected to a source connection electrode SCE_1 through a third contact hole CNT3_1.

More particularly, a first signal line part SL21_1 may include a (1-1) touch connection electrode TCE11_1 and a (2-1) touch connection electrode TCE21_1 overlapping each other, a second signal line part SL22_1 may include a source connection electrode SCE_1, a third signal line part SL23_1 may include a (1-2) touch connection electrode TCE12_1 and a (2-2) touch connection electrode TCE22_1, and a fourth signal line part SL24_1 may include a (1-2) touch connection electrode TCE12_2.

One side surface of the polarizing layer 430 and one side surface of the polarizing adhesive layer 410 of the polarization member 40 may be aligned in the thickness direction. The polarization member 40 can be substantially cover and protect the upper surface of the (2-1) touch connection electrode TCE21_1. The polarization member 40 may expose a part of the upper surface of the (2-1) touch connection electrode TCE21_1.

The source connection electrode SCE_1 of the second conductive layer DCL2 described above may be disposed on the via layer VIA in the bending region BR. The source connection electrode SCE_1 may be located in the bending region BR. The source connection electrode SCE_1 may be electrically connected to the (1-1) touch connection electrode TCE11_1 and the (1-2) touch connection electrode TCE12_1 through the second contact hole CNT2_1 and the third contact hole CNT3_1 in the bending region BR, respectively. The second contact hole CNT2_1 and the third contact hole CNT3_1 may penetrate the encapsulation layer 116, the bank layer 115, and the protective layer 114 under the second touch conductive layer TCL2, and may be electrically connected to the source connection electrode SCE_1 of the second conductive layer DCL2.

The bending protective layer 50 may be in direct contact with the exposed side surface of the (2-1) touch connection electrode TCE21_1 and the exposed side surface of the (2-2) touch connection electrode TCE22_1 of the second touch conductive layer TCL2. Moreover, the bending protective layer 50 may also be disposed on the exposed upper surface of the (2-1) touch connection electrode TCE21_1 to protect the upper surface and the side surfaces of the (2-1) touch connection electrode TCE21_1 from outside air or moisture. The bending protective layer 50 may be in contact with the second touch insulating layer 330 overlapping with the fourth signal line part SL24, without being limited thereto. In addition, the bending protective layer 50 may further cover the side surfaces and the upper surface of the (1-1) touch connection electrode TCE11_1, which is further extended to the bending region BR relative to the (2-1) touch connection electrode TCE21_1. The bending protective layer 50 may be in direct contact with the side surface and the upper surface of the (1-1) touch connection electrode TCE11_1, which is further extended to the bending region BR relative to the (2-1) touch connection electrode TCE21_1.

In the main region MR, the polarization member 40 is disposed on the touch member 30, and thus, the exposed second touch conductive layer TCL2 is covered by the polarization member 40. However, in the subsidiary region SR, the second touch conductive layer TCL2 may be exposed to the outside, and thus, is exposed to outside air or moisture. As such, in the touch member 30 according to the illustrated exemplary embodiment, unlike in the main region MR, in the subsidiary region SR, the second touch insulating layer 330 may cover the third signal line part SL23_1, the first touch conductive layer TCL1, e.g., the (1-2) touch connection electrode TCE12, such that the first touch conductive layer TCL1 is prevented from being exposed.

Figure 19:
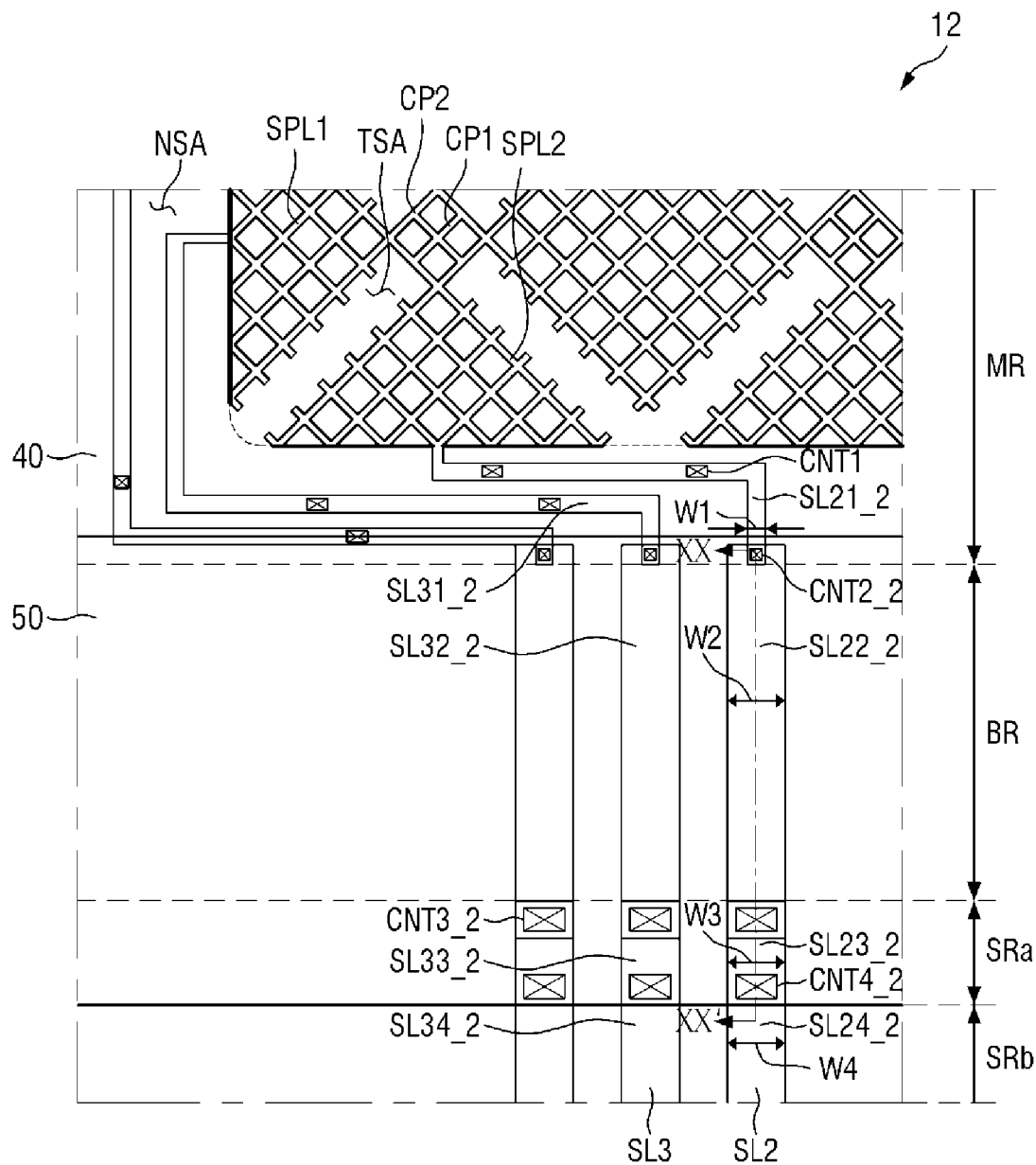
FIG. 19 is a view showing a layout of signal lines arranged in a main region, a bending region, and a subsidiary region according to yet another exemplary embodiment.

FIG. 19 is a view showing a layout of signal lines arranged in a main region, a bending region and a subsidiary region according to yet another exemplary embodiment. FIG. is a cross-sectional view taken along line XX-XX' of FIG. 19.

Figure 20:
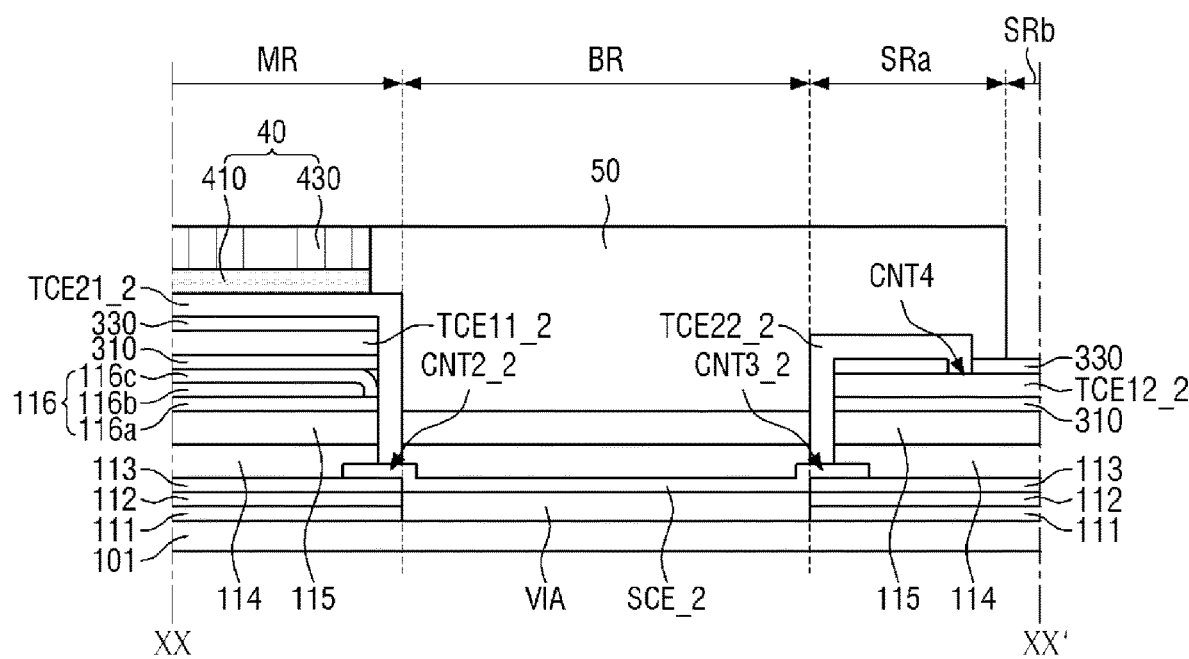
FIG. 20 is a cross-sectional view taken along line XX-XX' of FIG. 19.

Referring to FIGS. 19 and 20, in a display panel 12 according to the illustrated exemplary embodiment, a first signal line part SL21_2 may include a (1-1) touch connection electrode TCE11_2 of a first touch conductive layer TCL1, and a (2-1) touch conductive electrode TCE21_2 of a second touch conductive layer TCL2. The (2-1) touch connection electrode TCE21_2 may be disposed on the (1-1) touch connection electrode TCE11_2. The (1-1) touch connection electrode TCE11_2 and the (2-1) touch connection electrode TCE21_2 may be electrically connected to each other through a first contact hole CNT1_2.

The second signal line part SL22_2 may include a source connection electrode SCE_2 of the second conductive layer DCL2. The source connection electrode SCE_2 may be located in the bending region BR. The source connection electrode SCE_2 may be further extended toward one side and the other side of the bending region BR to be disposed on a part of the subsidiary region SR and the main region MR. The source connection electrode SCE_2 may be electrically connected to the (2-1) touch connection electrode TCE21_2 through the second contact hole CNT2_2 located in the main region MR.

The source connection electrode SCE_2 may be electrically connected to the (2-2) touch connection electrode TCE22_2 through a third contact hole CNT3_2 located in the subsidiary region SR.

The third signal line part SL23_2 may include the (1-2) touch connection electrode TCE12_2 of the first touch conductive layer TCL1 and the (2-2) touch connection electrode TCE22_2 of the second touch conductive layer TCL2. The (1-2) touch connection electrode TCE12_2 and the (2-2) touch connection electrode TCE22_2 may overlap each other in the thickness direction. The (1-2) touch connection electrode TCE12_2 and the (2-2) touch connection electrode TCE22_2 may be in electrical contact, like the first signal line part SL21_2, but the inventive concepts are not limited thereto.

The fourth signal line part SL24_2 may include the (1-2) touch connection electrode TCE12_2 of the first touch conductive layer TCL1, as in the display panel 10.

As described above, the first signal line part SL21_2 may include a (1-1) touch connection electrode TCE11_2 and a (2-1) touch connection electrode TCE21_2 overlapping each other, the second signal line part SL22_2 may include the source connection electrode SCE_2, the third signal line part SL23_2 may include the (1-2) touch connection electrode TCE12_2 and the (2-2) touch connection electrode TCE22_2 overlapping each other, and the fourth signal line part SL24_2 may include the (1-2) touch connection electrode TCE21_2.

One side surface of the polarizing layer 430 and one side surface of the polarizing adhesive layer 410 of the polarization member 40 may be aligned in the thickness direction. The polarization member 40 can substantially cover and protect the upper surface of the (2-1) touch connection electrode TCE21_2. The polarization member 40 may expose a part of the upper surface of the (2-1) touch connection electrode TCE21_2.

The source connection electrode SCE_2 of the second conductive layer DCL2 described above may be disposed on the via layer VIA in the bending region BR. The second contact hole CNT2_2 and the third contact hole CNT3_2 may penetrate the encapsulation layer 116, the bank layer 115, and the protective layer 114 under the second touch conductive layer TCL2, and may be electrically connected to the source connection electrode SCE_2 of the second conductive layer DCL2.

The bending protective layer 50 may be in direct contact with the exposed side surface of the (2-1) touch connection electrode TCE21_2 and the exposed side surface of the (2-2) touch connection electrode TCE22_2 of the second touch conductive layer TCL2. Moreover, the bending protective layer 50 may also be disposed on the exposed upper surface of the (2-1) touch connection electrode TCE21_2 and the exposed upper surface of the (2-2) touch connection electrode TCE22_2, to protect the upper surface and side surface of the (2-1) touch connection electrode TCE21_2 and the upper surface and side surface of the (2-2) touch connection electrode TCE22_2 from outside air or moisture. The bending protective layer 50 may be in contact with the second touch insulating layer 330 overlapping with the fourth signal line part SL24, without being limited thereto.

Figure 21:
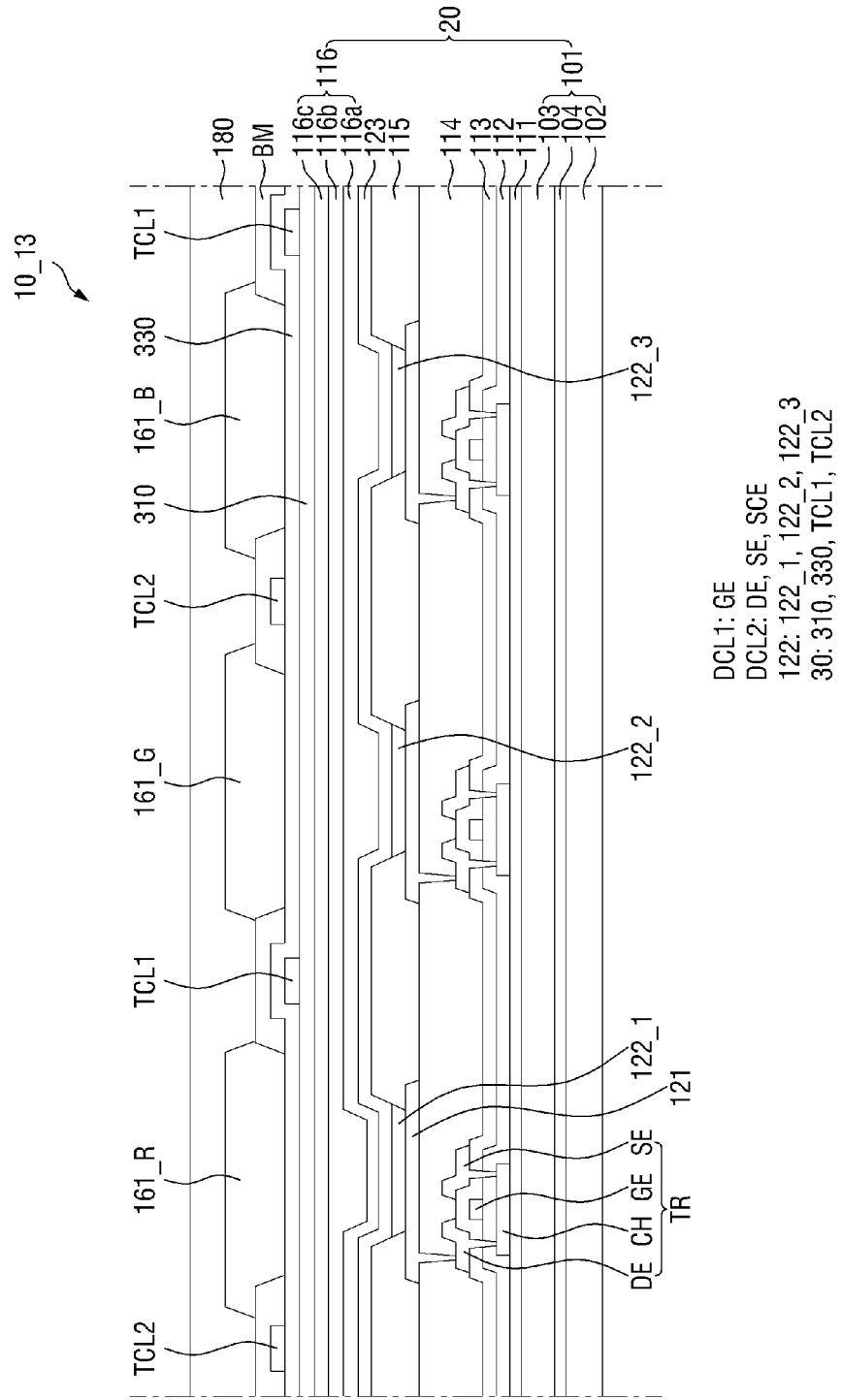
FIG. 21 is a cross-sectional view of a display panel according to another exemplary embodiment.

FIG. 21 is a cross-sectional view of a display panel according to another exemplary embodiment.

A display panel 13 according to the illustrated exemplary embodiment shown in FIG. 21 is substantially identical to the display panel 10 described above, except that color filters 161_R, 161_G, and 161_B, and a light-blocking pattern BM are disposed in the main region MR in place of the polarization member 40.

More particularly, the light-blocking pattern BM may be disposed on the second touch conductive layer TCL2. The sensing electrodes and the touch bridge connection electrodes of the second touch conductive layer TCL2 in the main region MR may be in contact with the light-blocking pattern BM. The light-blocking pattern BM may overlap the bank layer 115 disposed thereunder in the thickness direction. The light-blocking pattern BM may be a black matrix and may include a photosensitive organic material.

Color filters 161_R, 161_G, and 161_B may be disposed on the light-blocking pattern BM and the second touch conductive layer TCL2 in each of pixels. The color filters may include a red color filter 161_R transmitting red light and blocking green light and blue light, a green color filter 161_G transmitting green light and blocking red light and blue light, and a blue color filter 161_B transmitting blue light and blocking red light and green light. The color filters 161_R, 161_G, and 161_B may include a photosensitive organic material.

The plurality of sensing electrodes and the touch bridge connection electrodes of the second touch conductive layer TCL2 may be spaced apart from one another as described above. As the sensing electrodes and the touch bridge connection electrodes are spaced apart from one another, the upper surface of the second touch insulating layer 330 may be partially exposed. The color filters 161_R, 161_G and 161_B may be in contact with the exposed upper surface of the second touch insulating layer 330.

An organic planarization layer 180 may be disposed over the color filters 161_R, 161_G, and 161_B. The color filters 161_R, 161_G and 161_B may have level differences as shown in FIG. 21. The organic planarization layer 180 can provide a flat surface over the level differences. The organic planarization layer 180 may include an organic material.

The display panel according to the illustrated exemplary embodiment is different from the display panel 10 described above, in that the polarization member 40 is eliminated in the main region MR, but the light-blocking pattern BM is disposed in the main region MR, so that the sensing electrodes and the touch bridge connection electrodes of the second touch electrodes TCL2 exposed thereunder can be covered and protected.

Figure 22:
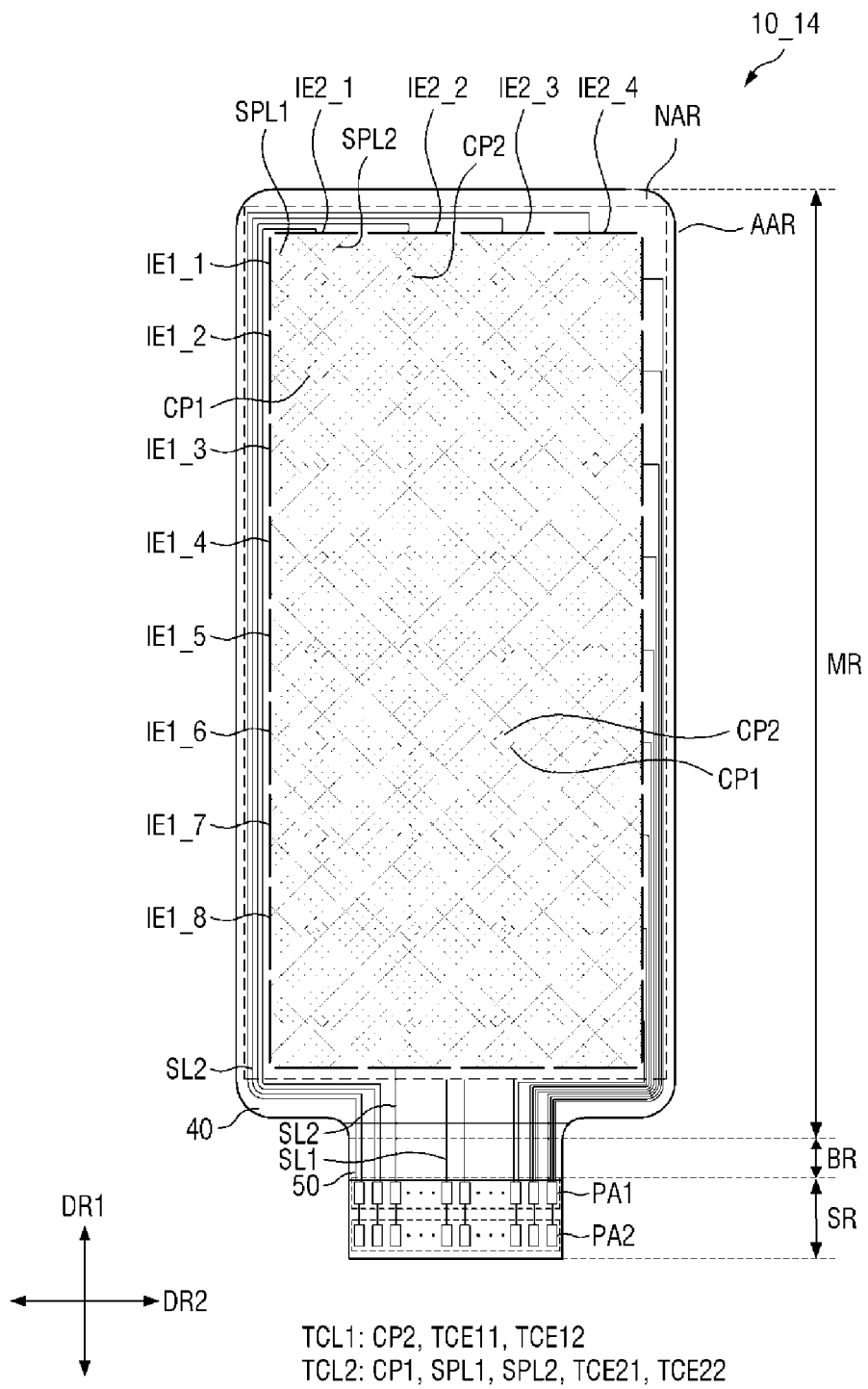
FIG. 22 is a plan view showing a layout of a display member and a touch member of a display device according to another exemplary embodiment.

FIG. 22 is a plan view showing a layout of a display member and a touch member of a display device according to another exemplary embodiment.

Referring to FIG. 22, in a touch member of a display panel 14 according to the illustrated exemplary embodiment, the first sensing electrodes IE1_1 to IE1_8 may be connected to a third signal line SL3 on the right side to be connected to the pad areas PA1 and PA2. The second sensing electrodes IE2_1 to IE2_4 may be connected to a second signal lines SL2 on the lower and upper sides to be connected to the pad areas PA1 and PA2.

Figure 23:
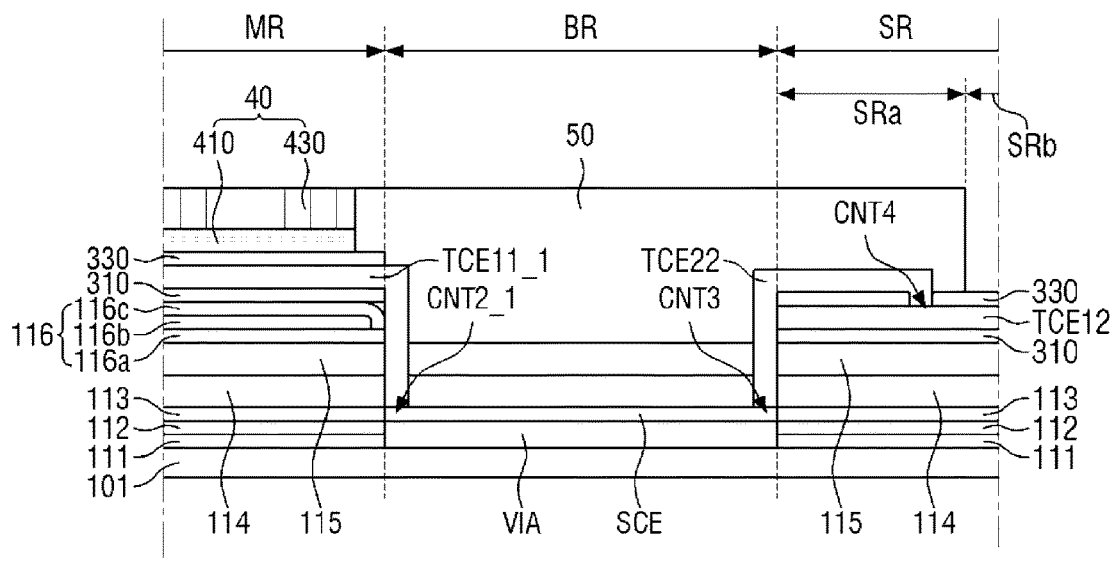
FIG. 23 is a cross-sectional view of a part of a display panel according to yet another exemplary embodiment.

FIG. 23 is a cross-sectional view of a part of a display panel according to yet another exemplary embodiment.

A display panel according to the illustrated exemplary embodiment shown in FIG. 23 is substantially identical to the display panel described above, except that a first touch line part located on the upper side of the bending region BR includes a (1-1) touch connected to electrodes TCE11_1.

More particularly, a (1-1) touch connection electrode TCE11_1 may be disposed on a first touch insulating layer 310, a second touch insulating layer 330 may be disposed on a (1-1) touch connection electrode TCE11_1. The upper surface of the second touch insulating layer 330 may be in contact with the polarization member 40.

Figure 24:
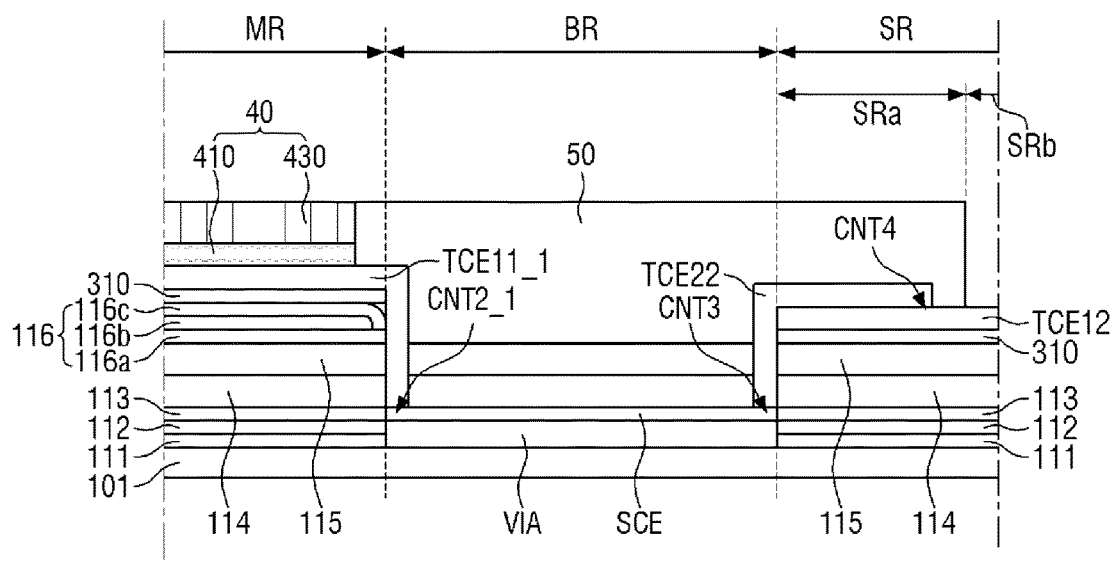
FIG. 24 is a cross-sectional view of a part of a display panel according to yet another exemplary embodiment.

FIG. 24 is a cross-sectional view of a part of a display panel according to yet another exemplary embodiment.

A display panel according to the illustrated exemplary embodiment shown in FIG. 24 is substantially identical to the display panel shown in FIG. 23, except that a second touch insulating layer 330 is eliminated and the upper surface of a (1-1) touch connection electrode TCE11_1 is in contact with a polarization member 40.

Figure 25:
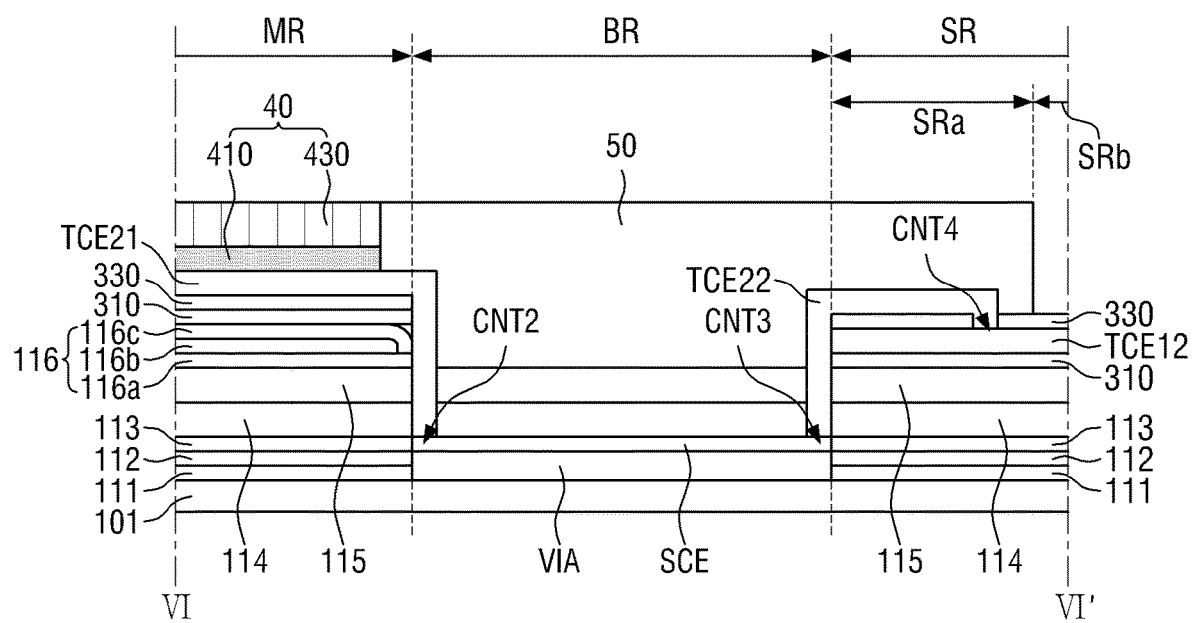
FIG. 25 is a cross-sectional view of a part of a display panel according to yet another exemplary embodiment.

FIG. 25 is a cross-sectional view of a part of a display panel according to yet another exemplary embodiment.

A display panel according to the illustrated exemplary embodiment shown in FIG. 25 is substantially identical to the display panel shown in FIG. 10, except that a (1-1) touch connection electrode TCE11 of a first touch line part is eliminated, and the first touch line part includes a (2-1) touch connection electrode TCE21 only.

The second touch insulating layer 330 may be in contact with the first touch insulating layer 310. In some exemplary embodiments, the second touch insulating layer 330 may be eliminated. In such case, the first touch line part may be in direct contact with the first touch insulating layer 310.

Figure 26:
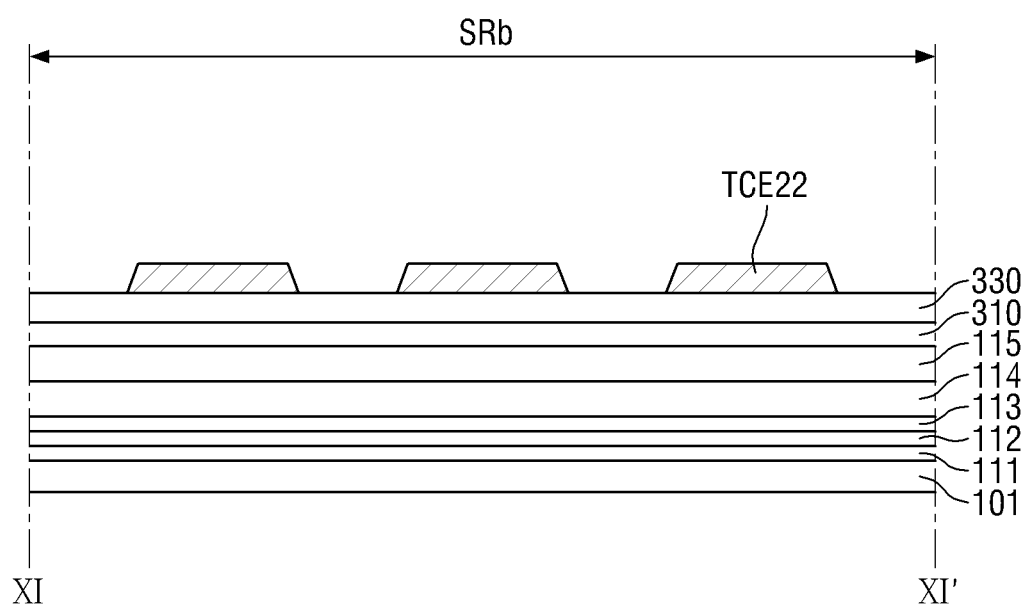
FIG. 26 is a cross-sectional view of a part of a display panel according to yet another exemplary embodiment.

FIG. 26 is a cross-sectional view of a part of a display panel according to yet another exemplary embodiment.

A display panel according to the illustrated exemplary embodiment shown in FIG. 26 is substantially identical to the display panel shown in FIG. 14, except that a (1-2) touch connection electrode TCE12 is eliminated and a (2-2) touch connection electrode TCE22 is disposed on a second touch insulating layer 330 in a second subsidiary region SRb.

According to exemplary embodiments, a touch member may not be deposited with an upper organic layer, and thus, the thickness of a display device including the touch member may be reduced. In addition, a touch member formed on a display member can prevent a conductive layer of the touch member from being exposed in a display device having a reduced thickness.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate having an active area and a non-active area, the non-active area including a first area, a second area, a third area, and a fourth area;
   a light-emitting element disposed on the substrate and overlapping the active area;
   a touch layer disposed on the substrate and having a main touch area overlapping the active area; and
   an encapsulation layer disposed between the light-emitting element and the touch layer;
   wherein the first area is disposed between the active area and the second area,
   wherein the third area is disposed between the second area and the fourth area,
   wherein the second area and the third area are disposed between the first area and the fourth area,
   wherein the touch layer includes touch electrodes disposed in the main touch area and touch lines connected to the touch electrodes, a portion of the touch lines overlapping the non-active area, and
   wherein the touch lines include a first touch line part overlapping the first area of the substrate and a second touch line part overlapping the third area of the substrate,
   wherein the touch layer includes:
   a first touch conductive layer disposed on the substrate;
   a touch insulating layer disposed on the first touch conductive layer; and
   a second touch conductive layer disposed on the touch insulating layer, the second touch conductive layer including the touch electrodes;
   wherein the first touch line part includes the first touch conductive layer and the second touch conductive layer, and
   wherein the second touch line part includes the first touch conductive layer and does not include the second touch conductive layer.

2. The display device of claim 1, wherein the second area is an area where the substrate is bent, and
   wherein the fourth area is an area where a plurality of pads are disposed on the substrate.

3. The display device of claim 1, wherein the touch insulating layer covers the second touch line part.

4. The display device of claim 1, wherein:
   the first touch conductive layer includes:
   a first touch connection electrode disposed in the main touch area and forming the first touch line part; and
   a second touch connection electrode forming the second touch line part;
   the second touch conductive layer includes a third touch connection electrode forming the first touch line part; and
   the first touch connection electrode and the third touch connection electrode overlap each other in a thickness direction and are electrically connected to each other.

5. The display device of claim 1, wherein the touch lines further include a third touch line part overlapping the second area of the substrate,
   wherein the third touch line part includes a source connection electrode, and
   wherein the source connection electrode is disposed on a layer different from the first touch conductive layer and the second touch conductive layer.

6. The display device of claim 5, wherein the source connection electrode is electrically connected to the first touch line part and the second touch line part.

7. The display device of claim 6, further comprising:
   an insulating layer disposed between the substrate and the light-emitting element; and
   a display conductive layer disposed between the substrate and the insulating layer,
   wherein the display conductive layer includes an electrode electrically connected to the light-emitting element and the source connection electrode.

8. The display device of claim 7, further comprising:
   a via layer disposed between the source connection electrode and the substrate; and
   a bending protective layer disposed on the source connection electrode,
   wherein the bending protective layer overlaps a portion of the first touch line part.

9. The display device of claim 5, wherein the encapsulation layer does not overlap the second area of the substrate.

10. The display device of claim 5, wherein the non-active area further includes a fifth area disposed between the second area and the third area,
    wherein the touch lines further include a fourth touch line part overlapping the fifth area of the substrate, and
    wherein the fourth touch line part includes the first touch conductive layer and the second touch conductive layer.

11. The display device of claim 10, wherein the first touch line part and the second touch line part are electrically connected via the source connection electrode and the fourth touch line part.

12. The display device of claim 10, wherein the encapsulation layer does not overlap the fifth area of the substrate.

13. A display device comprising:
a display member including a substrate having an active area and a non-active area around the active area, and light-emitting elements disposed on the substrate, the non-active area including a bending region; and
a touch member disposed on the display member and having a main touch area,
wherein the touch member includes touch electrodes disposed in the main touch area and touch lines connected to the touch electrodes, the main touch area corresponding to the active area and a portion of the touch lines corresponding to the non-active area,
wherein the touch lines include a first touch line part disposed on a first side of the bending region and a second touch line part disposed on a second side of the bending region, the first side of the bending region being interposed between the active area and the second side of the bending region, and
wherein the number of conductive layer forming the first touch line part is greater than the number of conductive layer forming the second touch line part.

14. The display device of claim 13, wherein:
the touch member includes:
a first touch insulating layer disposed on the display member;
a first touch conductive layer disposed on the first touch insulating layer;
a second touch insulating layer disposed on the first touch conductive layer; and
a second touch conductive layer disposed on the second touch insulating layer;
the first touch line part includes the first touch conductive layer and the second touch conductive layer electrically connected to the first touch conductive layer; and
the second touch line part includes the first touch conductive layer.

15. The display device of claim 14, wherein:
the first touch conductive layer includes:
a (1-1) touch connection electrode disposed in the main touch area and forming the first touch line part; and
a (1-2) touch connection electrode forming the second touch line part;
the second touch conductive layer includes a (2-1) touch connection electrode forming the first touch line part; and
the (1-1) touch connection electrode and the (2-1) touch connection electrode overlap each other in a thickness direction and are electrically connected to each other through a first contact hole.

16. The display device of claim 15, further comprising a polarization member disposed on the first side of the bending region on the first touch line part,
wherein the polarization member includes a polarizing layer and a polarizing adhesive layer disposed on the polarizing layer and directly contacting the (2-1) touch connection electrode.

17. The display device of claim 16, wherein the touch lines further include a third touch line part disposed between the first touch line part and the second touch line part,
wherein the third touch line part includes a source connection electrode disposed in the bending region and electrically connected to the (2-1) touch connection electrode through a second contact hole.

18. The display device of claim 17, wherein the second contact hole is disposed in the bending region.

19. The display device of claim 17, wherein the display member further includes:
a buffer layer disposed on the substrate;
a first display conductive layer disposed on the buffer layer;
a first insulating layer disposed on the first display conductive layer;
a second display conductive layer disposed on the first insulating layer; and
a protective layer disposed on the second display conductive layer.

20. The display device of claim 19, further comprising:
a via layer disposed between the second display conductive layer and the substrate; and
a bending protective layer disposed between the via layer and the protective layer in the bending region; and
wherein the second display conductive layer includes the source connection electrode.

21. The display device of claim 20, wherein the touch lines further include a fourth touch line part disposed between the third touch line part and the second touch line part,
wherein the second touch conductive layer further includes a (2-2) touch connection electrode forming the fourth touch line part and overlapping the (1-2) touch connection electrode in a thickness direction.

22. The display device of claim 21, wherein:
the (2-2) touch connection electrode is electrically connected to the source connection electrode through a third contact hole, and is electrically connected to the (1-2) touch connection electrode through a fourth contact hole; and
the third contact hole is disposed closer to the bending region than the fourth contact hole.

23. The display device of claim 22, wherein the bending protective layer is extended to the first side of the bending region and is in contact with an upper surface and a side surface of the (2-1) touch connection electrode.

24. The display device of claim 22, wherein the third contact hole is disposed in the bending region, and the fourth contact hole is disposed on the second side of the bending region.

25. The display device of claim 20, wherein a side surface of the bending protective layer is in direct contact with a side surface of the polarization member.

26. The display device of claim 16, wherein:
the touch lines further include a third touch line part disposed between the first touch line part and the second touch line part; and
the third touch line part includes a source connection electrode disposed in the bending region and electrically connected to the (1-1) touch connection electrode through a second contact hole disposed in the bending region.

27. The display device of claim 26, wherein:
the (1-2) touch connection electrode is electrically connected to the source connection electrode through a third contact hole disposed in the bending region; and
the third contact hole is disposed closer to the second side of the bending region than the second contact hole.

28. The display device of claim 15, wherein a first width of the first touch line part is less than a second width of the second touch line part.

29. The display device of claim 15, further comprising a light-blocking pattern overlapping the first side of the bending region on the touch member, and a color filter layer, wherein the light-blocking pattern is in direct contact with the second touch conductive layer.

* * * * *